(12) United States Patent
Hayashi

(10) Patent No.: US 8,351,005 B2
(45) Date of Patent: Jan. 8, 2013

(54) TFT SUBSTRATE HAVING MULTIPLE PIXELS, LIQUID CRYSTAL DISPLAY DEVICE USING THE TFT SUBSTRATE, AND METHOD FOR MANUFACTURING THE TFT SUBSTRATE

(75) Inventor: Masami Hayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 562 days.

(21) Appl. No.: 12/417,134

(22) Filed: Apr. 2, 2009

(65) Prior Publication Data
US 2009/0251653 A1 Oct. 8, 2009

(30) Foreign Application Priority Data
Apr. 3, 2008 (JP) ................. 2008-097251

(51) Int. Cl.
*G02F 1/1343* (2006.01)
*H01L 21/77* (2006.01)
*H01L 27/12* (2006.01)
(52) U.S. Cl. ................. 349/139; 257/E27.111
(58) Field of Classification Search ............. 349/139, 349/140, 141–145, 40, 122; 257/59, E27.111, 257/E21.535; 438/30, 608, 151, 155, 711
See application file for complete search history.

(56) References Cited

U.S. PATENT DOCUMENTS

| | | | |
|---|---|---|---|
| 6,653,216 B1 * | 11/2003 | Shimomaki et al. | 438/608 |
| 6,678,017 B1 * | 1/2004 | Shimomaki et al. | 349/40 |
| 7,064,799 B2 * | 6/2006 | Okamoto et al. | 349/114 |
| 7,586,572 B2 * | 9/2009 | Kimura et al. | 349/139 |
| 7,755,088 B2 | 7/2010 | Kobayashi et al. | |
| 7,956,473 B2 * | 6/2011 | Momono et al. | 257/782 |
| 2001/0020991 A1 * | 9/2001 | Kubo et al. | 349/113 |
| 2002/0079503 A1 * | 6/2002 | Yamazaki et al. | 257/89 |
| 2005/0077517 A1 * | 4/2005 | Chang et al. | 257/59 |
| 2007/0188683 A1 * | 8/2007 | Naka | 349/114 |

FOREIGN PATENT DOCUMENTS

| | | |
|---|---|---|
| JP | 2002-107762 | 4/2002 |
| JP | 2005-215276 | 8/2005 |
| JP | 2007-213065 | 8/2007 |

OTHER PUBLICATIONS

U.S. Appl. No. 13/281,893, filed Oct. 26, 2011, Hayashi, et al.
Japanese Office Action (with English translation) mailed Sep. 4, 2012, in Japanese Patent Application No. 2008-097251, filed Apr. 3, 2008.

\* cited by examiner

Primary Examiner — Akm Ullah
(74) Attorney, Agent, or Firm — Oblon, Spivak, McClelland, Maier & Neustadt, L.L.P.

(57) ABSTRACT

The TFT substrate having a transparent conductive film pattern configuring a terminal that can be connected from outside and a first line extending from the terminal; a metal film that is removed from over the terminal and formed on the transparent conductive film pattern on the inside thereof; and an insulating film covering the metal film.

7 Claims, 39 Drawing Sheets

TFT SUBSTRATE HAVING MULTIPLE PIXELS, LIQUID CRYSTAL DISPLAY DEVICE USING THE TFT SUBSTRATE, AND METHOD FOR MANUFACTURING THE TFT SUBSTRATE

BACKGROUND OF THE INVENTION

1. Field of the Invention

The present invention relates to a TFT substrate, a liquid crystal display device using same, and a method for manufacturing same.

2. Description of Related Art

TFT array substrates using a thin-film transistor (TFT) as a switching element are widely used in display devices and the like. A technology for obtaining a two-layer structure of a gate line of the TFT array substrate has been disclosed. In Japanese Unexamined Patent Application Publication No. 2002-107762, the gate line has a two-layer structure in which a transparent conductive film and a metal film are successively stacked. The transparent conductive film is identical to the transparent conductive film forming a pixel electrode. Because the gate line terminal has the same configuration as the gate line, the gate line terminal also has a configuration in which a transparent conductive film and a metal film are stacked. In Japanese Unexamined Patent Application Publication No. 2002-107762, a metal film is further stacked on the gate line terminal.

Where the gate line has a two-layer structure as described hereinabove, the uppermost layer of the gate line terminal will be a metal film. This is true when the gate line terminal has a two-layer structure identical to that of the gate line and also when only the gate line terminal has a three-layer structure as described in Japanese Unexamined Patent Application Publication No. 2002-107762. Furthermore, the gate line terminal is also exposed to the outside to enable external connection. As a result, in a case where a metal film of an Al system is used as the metal film, local corrosion occurs on the gate line terminal in an atmosphere in which chlorine or the like is present.

Furthermore, a short ring line is sometimes formed in a TFT array substrate. The short ring line is formed to prevent element abnormalities caused by electric charging when the TFT array substrate is formed. The short ring line is eventually removed by cutting the TFT array substrate. Because the short ring line is formed to stride the cutting line, the short ring line is exposed in the cut surface of the substrate. Since the short ring line extends from a terminal such as a gate line terminal, in most cases the short ring line has a configuration identical to that of the gate line terminal. Thus, the short ring line also has a metal film, and the metal film of the short ring line is exposed in the cut surface. As a result, local corrosion occurs in an atmosphere in which chlorine or the like is present.

In a case of a TFT array substrate for use in a transflective liquid crystal display device, a reflective electrode and a transmissive electrode are used as pixel electrodes. In the step of forming the reflective electrode and transmissive electrode, initially, a transparent conductive film and a reflective film are successively formed. Then, they are sometimes patterned by using a resist having a two-step film thickness. As a result, a photoengraving step can be reduced. However, in patterning using a resist having a two-step film thickness, a film of the reflective electrode is sometimes left due to the effect of step in the terminal region where the transmissive electrode is to be formed. As a result, local corrosion occurs in the same manner as described above. When local corrosion thus occurs, reliability of the TFT substrate decreases.

SUMMARY OF THE INVENTION

The present invention has been created to overcome the above-described problems, and it is an object of the present invention to provide a TFT substrate with improved reliability, a liquid crystal display device using such a substrate, and a method for manufacturing same.

The TFT in accordance with the present invention includes a transparent conductive film pattern configuring a terminal that can be connected from outside and a first line extending from the terminal; a metal film that is removed from over the terminal and formed on the transparent conductive film pattern on the inside thereof; and an insulating film covering the metal film.

The method for manufacturing a TFT substrate in accordance with the present invention includes the steps of: forming a terminal and a first line extending from the terminal by successively forming a transparent conductive film and a metal film in a formation region of the first line and removing the metal film located on the transparent conductive film in a formation region of the terminal; and forming an insulating film so as to cover the metal film.

With the present invention, it is possible to provide a TFT substrate with improved reliability, a liquid crystal display device using such a substrate, and a method for manufacturing same.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Embodiment 1

A display device using a TFT substrate will be described below. A flat panel display such as a liquid crystal display device and an EL display (field-emission display device) is an example of the display device. The EL display device can be, for example, an organic EL display device and an inorganic EL display device. A liquid crystal display device will be explained below as an example of display device.

A liquid crystal display device has a liquid crystal panel, a control circuit, and a backlight unit. The liquid crystal panel has a TFT substrate and an opposing substrate disposed opposite the TFT substrate. The TFT substrate and the opposing substrate are pasted together by using a sealing material on the circumference of the display region. A liquid crystal layer is formed between the two substrates and the sealing material. A functional film, for example, a polarizing film is pasted on the outer surfaces of the TFT substrate and the opposing substrate. The backlight unit is disposed on the side of the liquid crystal panel that is opposite the viewing side. Light illumination is performed with the backlight unit from the back surface side of the liquid crystal panel.

The control circuit supplies signals necessary to perform display on the liquid crystal panel. The control circuit is carried on a flexible board. The control circuit may be also divided and carried on a liquid crystal panel, a flexible board, and a FPC (Flexible Printed Circuit). Furthermore, part of the circuit may be also formed on the TFT substrate.

Figure 1:
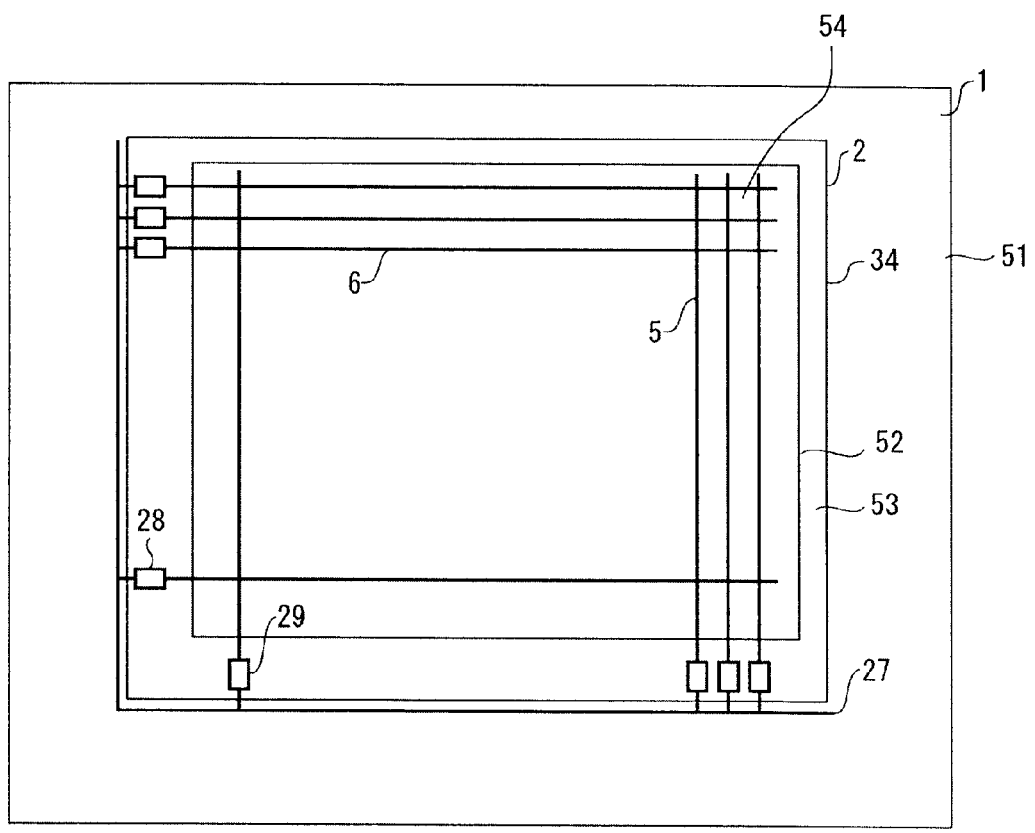
FIG. 1 is a plan view illustrating the configuration of a TFT array substrate according to Embodiment 1.

The aforementioned TFT substrate will be explained below with reference to FIG. 1. The TFT substrate as referred to herein is, for example, a TFT array substrate in which thin-film transistors (TFT) used as switching elements are arranged in an array-like configuration. FIG. 1 is a plan view illustrating the configuration of a TFT array substrate. The TFT array substrate 1 is eventually cut out along a panel cutting line 34, but the TFT array substrate 1 prior to cutting will be explained herein.

The TFT array substrate 1 has a panel region 2 that is eventually used as the TFT array substrate 1 of a liquid crystal panel and a removal region 51 that is removed by cutting in the manufacturing step. Thus, the outer circumference of the panel region 2 is a panel cutting line 34. A display region 52 and a frame region 53 provided so as to surround the display region 52 are provided in the panel region 2. A plurality of gate lines (scan signal lines) 6, a plurality of source lines (display signal lines) 5, and a plurality of common lines (not shown in the figure) are formed in the display region 52. The plurality of gate lines 6 and common lines are provided parallel to each other. Likewise, the plurality of source lines 5 are provided parallel to each other. The common lines are provided between respective adjacent gate lines 6. Thus, the gate lines 6 and common lines are arranged alternately.

The gate lines 6 and source lines 5 are formed so as to cross each other. Likewise, the common lines and source lines 5 are formed so as to cross each other. Furthermore, the gate lines 6 and source lines 5 are perpendicular to each other. Likewise the common lines and source lines 5 are perpendicular to each other. A region surrounded by the adjacent gate lines 6 and adjacent source lines 5 is a pixel 54. Therefore, in the display region 52, the pixels 54 are arranged in a matrix-like configuration.

The gate lines 6 extend from the display region 52 to the frame region 53. Each gate line 6 has a gate line terminal 28 at an end portion thereof. The source lines 5 also extend from the display region 52 to the frame region 53. Each source line 5 has a source line terminal 29 at end portion thereof.

Various signals are supplied from the control circuit to the liquid crystal panel via the gate line terminals 28 and source line terminals 29. More specifically, a gate signal (scan signal) is supplied to the gate lines 6 via the gate line terminals 28. The gate lines 6 are successively selected based on this gate signal. A display signal (display voltage) is supplied to the source lines 5 via the source line terminals 29. As a result, a display voltage corresponding to display data can be supplied to each pixel 54.

A short ring line 27 is formed in the outer edge portion of the panel region 2. The short ring line 27 extends from respective gate line terminals 28 and source line terminals 29. The short ring line 27 extends from the panel region 2 toward the removal region 51. Thus, the short ring line 27 is formed to stride over the panel cutting line 34. Furthermore, the short ring line 27 is formed to have an L-like shape along the outer contour of the panel region 2 in the removal region 51. The short ring line 27 can prevent the breakdown of elements such as TFT that can occur in the step of manufacturing the TFT array substrate 1.

Figure 2:
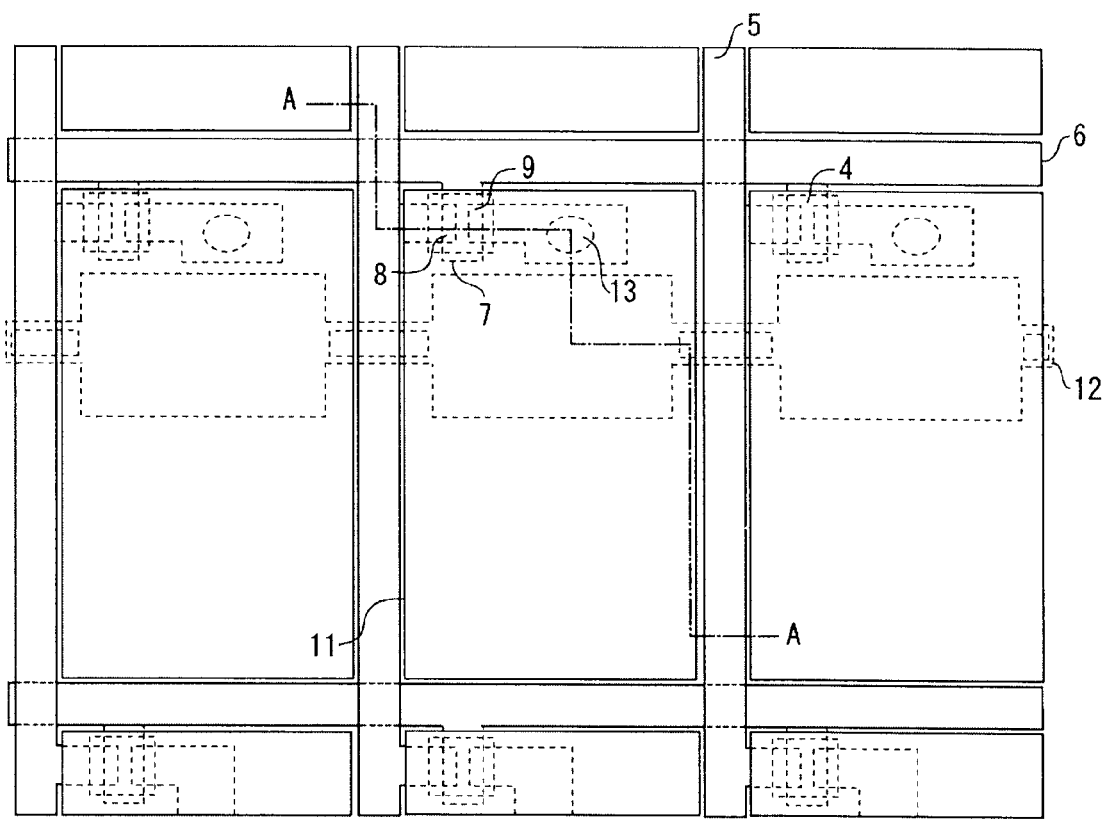
FIG. 2 is a plan view illustrating the configuration of a pixel according to Embodiment 1.
Figure 16A:
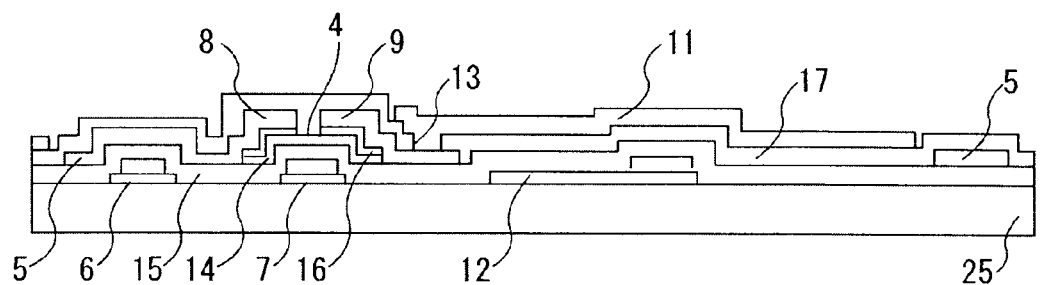
FIGS. 16A to 16C are cross-sectional views illustrating a step of manufacturing a TFT array substrate according to Embodiment 1.

The configuration of the pixel 54 will be explained below with reference to FIG. 2 and FIG. 16A. FIG. 2 is a plan view illustrating the configuration of the pixel 54. FIG. 16A is an A-A sectional view of the configuration shown in FIG. 2.

Gate lines 6, gate electrodes 7, and common line 12 are formed on a transparent insulating substrate 25 composed of glass or the like. The gate lines 6, gate electrodes 7, and common line 12 have a two-layer structure obtained by successive lamination of a transparent conductive film and a metal film. The gate electrodes 7 extend from the gate lines 6. The metal film of the upper layer in the gate lines 6 and gate electrodes 7 is formed somewhat smaller than the transparent conductive film pattern of the lower layer. Thus, the metal film is formed on the inside of the transparent conductive film pattern. In other words, the metal film is formed so as not to protrude from the transparent conductive film pattern. The gate lines 6 extend along the plurality of pixels 54 and supply gate signals to gate electrodes 7 of respective pixels 54.

The common lines 12 extends along the plurality of pixels 54 and supplies common signals to respective pixels 54. The common lines 12 is formed to a larger width within the pixels 54. No metal film is present in the common line 12 within the pixel 54. Thus, the common line 12 within the pixel 54 is formed only by the transparent conductive film. As a result, the opening ratio can be increased. Furthermore, the width of the common line 12 is decreased between the adjacent pixels 54, that is, in a portion that overlaps the source line 5. Furthermore, in this portion, the common line 12 is formed by the metal film of the upper layer and the transparent conductive film of the lower layer.

The gate insulating film 15 is formed so as to cover the gate line 6, gate electrode 7, and common line 12. A semiconductor layer 14 is formed on the gate insulating film 15. The semiconductor layer 14 is disposed opposite the gate electrode 7 with the gate insulating film 15 interposed therebetween. An ohmic contact layer 16 is formed on the semiconductor layer 14. The ohmic contact layer 16 is a semiconductor layer containing a doping element and has electric conductivity. The ohmic contact layer 16 is formed at both ends of the semiconductor layer 14. Thus, the ohmic contact layer 16 is not present in the central portion of the semiconductor layer 14 above the gate electrode 7. A portion where the ohmic contact layer 16 is not present is a channel 4. A source-drain region is formed outside the channel 4.

A source electrode 8 and a drain electrode 9 are formed on the ohmic contact layer 16. The ohmic contact layer 16 is in contact with the source electrode 8 and drain electrode 9. As described hereinabove, the ohmic contact layer 16 is formed at both ends of the semiconductor layer 14. Thus, the source electrode 8 and drain electrode 9 are formed so as to sandwich the channel 4. More specifically, the source electrode 8 is formed on the source region. The drain electrode 9 is formed on the drain region. The source electrode 8 extends from the source line 5. The source line 5 extends along a plurality of pixels 54 and supplies a source signal to the source electrode 8 of each pixel 54. Furthermore, the source electrode 8 and the drain electrode 9 are formed so that they do not protrude beyond the ohmic contact layer 16 formed therebelow.

A passivation film 17 is formed to cover the source electrode and drain electrode. A contact hole 13 is formed in the passivation film 17 above the drain electrode 9. Thus, the passivation film 17 is not present in a portion above the drain electrode 9. A transmissive electrode 11 serving as a pixel electrode is then formed on almost the entire pixel 54. Thus, the transmissive electrode 11 is formed in a region surrounded by the adjacent gate lines 6 and adjacent source lines 5. The transmissive electrode 11 overlaps the drain electrode 9 and common line 12. In other words, the transmissive electrode 11 overlaps the underlying common line 12 via the gate insulating film 15 and passivation film 17. As a result, an electric charge is accumulated between the common line 12 and the transmissive electrode 11. The common line 12 also configures an auxiliary capacitance for holding for a fixed time a voltage applied to the transmissive electrode 11. The transmissive electrode 11 is embedded in the contact hole 13. The transmissive electrode 11 and the drain electrode 9 are connected via the contact hole 13.

A TFT is configured by the above-described gate electrode 7, gate insulating film 15, semiconductor layer 14, ohmic contact layer 16, source electrode 8, and drain electrode 9. At least one TFT is formed within the pixel 54. The TFT is disposed close to a crossing point of the gate line 6 and source line 5. The TFT and the auxiliary capacitance are connected in series within the pixel 54. For example, the TFT applies a display voltage to the transmissive electrode 11. The gate electrode 7 of the TFT that is a switching element is connected to the gate line 6 and controls ON and OFF of the TFT by a signal inputted from the gate line terminal 28. The source electrode 8 of the TFT is connected to the source line 5. Where a voltage is applied to the gate electrode 7, an electric current starts flowing from the source line 5. As a result, a display voltage is applied from the source line 5 to the transmissive electrode 11 connected to the drain electrode 9 of the TFT.

Furthermore, an electric field corresponding to the display voltage is generated between the transmissive electrode 11 and the opposite electrode.

Figure 3:
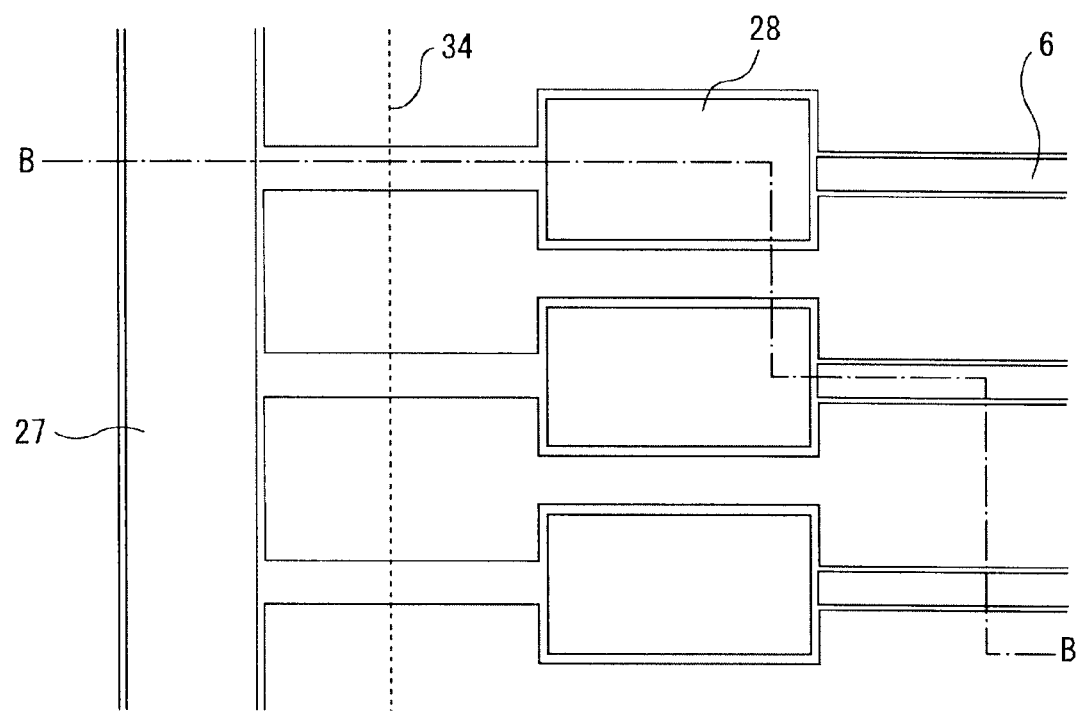
FIG. 3 is a plan view illustrating the configuration of a gate line terminal according to Embodiment 1 and a peripheral region thereof.
Figure 16B:
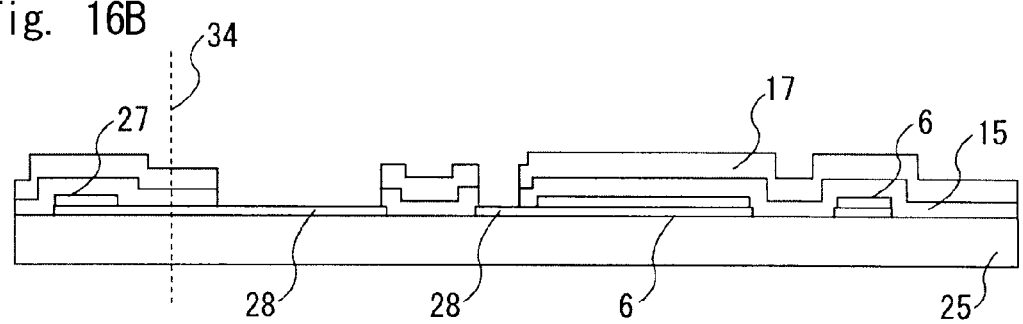

The gate line terminal 28 and the peripheral region thereof will be explained hereinbelow with reference to FIG. 3 and FIG. 16B. FIG. 3 is a plan view illustrating the configuration of the gate line terminal 28 and the peripheral region thereof. FIG. 16B is a B-B sectional view of the configuration shown in FIG. 3.

The gate line 6, gate line terminal 28, and short ring line 27 are formed on the insulating substrate 25. The gate line 6, gate line terminal 28, and short ring line 27 are electrically connected. The gate line terminal 28 is formed in a rectangular shape. Lines extend from both sides of the gate line terminal 28. One of these lines is the short ring line 27. The other one is the gate line 6. The gate line 6 is electrically connected to the TFT within the display region 52. In FIG. 3 the TFT array substrate 1 has a removal region 51 on the left side of the panel cutting line 34 and a display region 52 on the right side. Thus, the line on the left side of the gate line terminal 28 is the short ring line 27. The line on the right side of the gate line terminal 28 is the gate line 6.

The gate line 6 and the short ring line 27 have a two-layer structure in which a transparent conductive film and a metal film are successively stacked. The periphery of the gate line terminal 28 and panel cutting line 34 has no metal film and is formed of a single layer of the transparent conductive film. More specifically, a transparent conductive film pattern is integrally formed in the formation region of the gate line 6, gate line terminal 28, and short ring line 27. Thus, the transparent conductive film pattern constitutes the gate line 6, gate line terminal 28, and short ring line 27. The transparent conductive film pattern is formed to be as wide as the formation region of the gate line terminal 28. The metal film is formed only in the formation region of the gate line 6 and short ring line 27. The metal film is formed in an L-like shape in the formation region of the short ring line 27. Thus, as shown in FIG. 1, the metal film is formed in a portion of the short ring line 27 formed in an L-like shape in the removal region 51. The metal film is thus formed outside the periphery of the panel cutting line 34 and outside the gate line terminal 28. Thus, the metal film is removed in the vicinity of the panel cutting line 34 and at the gate line terminal 28. Furthermore, the metal film formed in the formation regions of the gate line 6 and short ring line 27 is formed to be less than the underlying transparent conductive pattern. Thus, the metal film is formed on the inside of the underlying transparent conductive pattern.

The gate insulating film 15 and passivation film 17 are then successively formed on the gate line 6 and short ring line 27. The gate insulating film 15 and passivation film 17 are not present on the gate line terminal 28. In other words, the gate insulating film 15 and passivation film 17 are formed almost entirely outside the gate line terminal 28. As a result, the metal films of the gate line 6 and short ring line 27 are covered by these insulating films. Furthermore, in the vicinity of the gate line terminal 28, only the outer circumference of the transparent conductive film pattern is covered by the gate insulating film 15 and passivation film 17. Thus, as shown in FIG. 3, an opening of the gate insulating film 15 and passivation film 17 is formed inside the portion formed by a single layer of the transparent conductive film in the vicinity of the gate line terminal 28.

Figure 4:
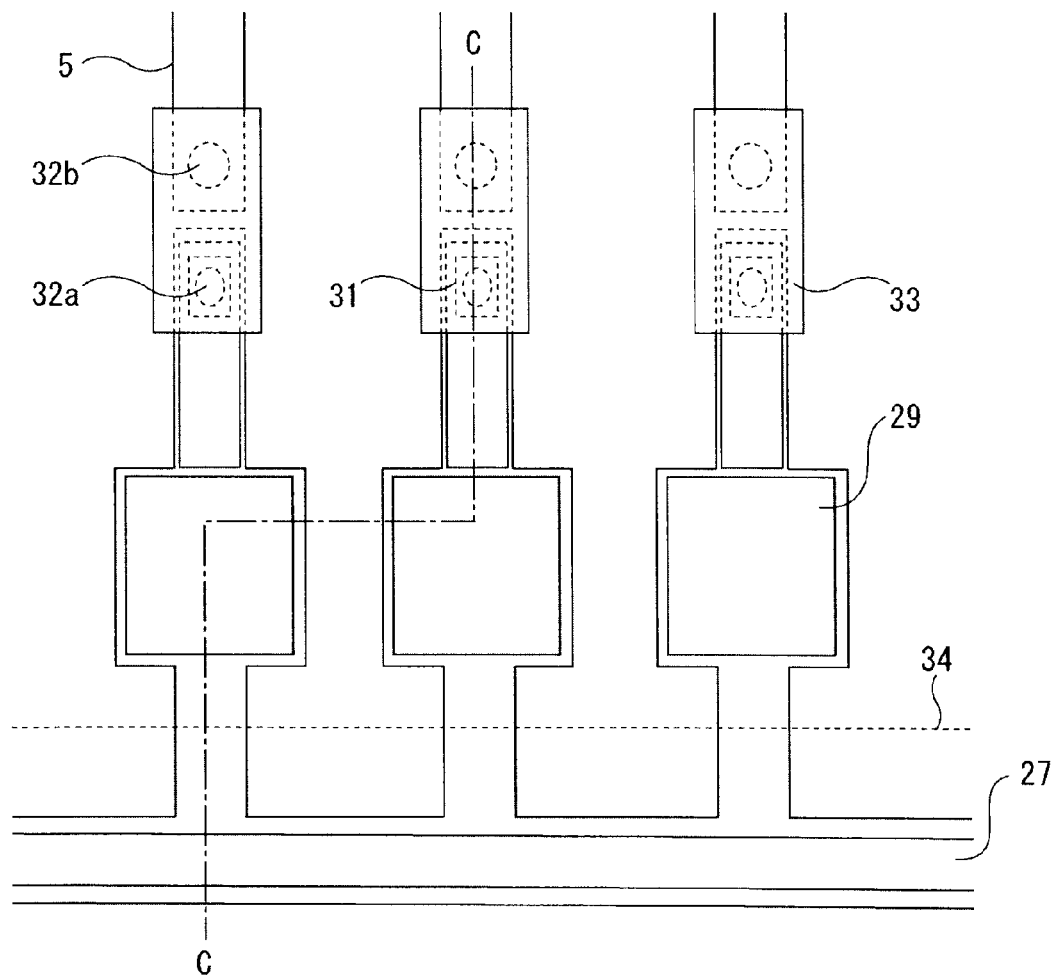
FIG. 4 is a plan view illustrating the configuration of a source line terminal according to Embodiment 1 and a peripheral region thereof.
Figure 16C:
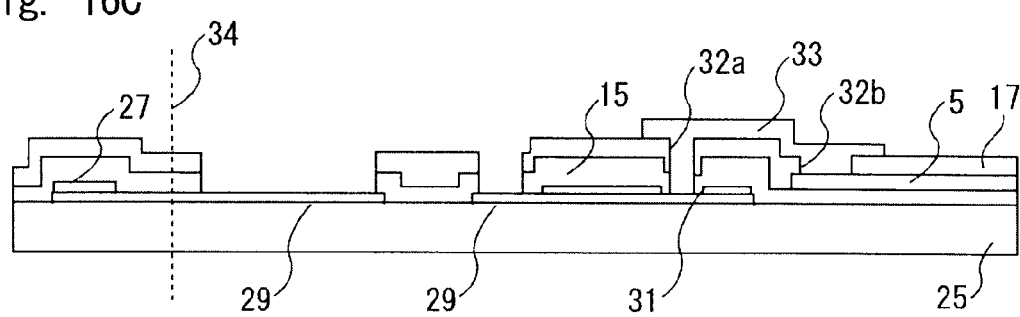

The source line terminal 29 and the peripheral region thereof will be explained below with reference to FIG. 4 and FIG. 16C. FIG. 4 is a plan view illustrating the configuration of the source line terminal 29 and the peripheral region thereof. FIG. 16C is C-C sectional view of the configuration shown in FIG. 4.

The source line terminal 29 and short ring line 27 are formed on the insulating substrate 25. Furthermore, a lead-out line that is led out from the source line terminal 29 to the side of the display region 52 is also formed on the insulating substrate 25. The source line terminal 29, short ring line 27, and lead-out line are electrically connected. The source line terminal 29 is formed in a rectangular shape. Lines extend from both sides of the source line terminal 29. One of the lines is the short ring line 27. The other one is the lead-out line. The lead-out line is electrically connected to the TFT within the display region 52 via the source line 5 or the like. In FIG. 4, the TFT array substrate 1 has the removal region 51 below the panel cutting line 34 and the display region 52 above the panel cutting line. Thus, the line below the source line terminal 29 is the short ring line 27. The line above the source line terminal 29 is the lead-out line.

The short ring line 27 has a two-layer structure in which a transparent conductive film and a metal film are successively stacked. Furthermore, the lead-out line that is led out from the source line terminal 29 into the panel plane also has a two-layer structure in which a transparent conductive film and a metal film are successively stacked. The periphery of the source line terminal 29 and the panel cutting line 34 has no metal film and is formed of a single layer of the transparent conductive film.

More specifically, the transparent conductive film pattern is formed integrally in the formation regions of the source line terminal 29, lead-out line, and short ring line 27. Thus, the transparent conductive film pattern constitutes the source line terminal 29, lead-out line, and short ring line 27. The transparent conductive film pattern is formed to be as wide as the formation region of the source line terminal 29. The metal film is formed only in the formation region of the short ring line 27 and lead-out line. Thus, the metal film is formed on the outside of the periphery of the panel cutting line 34 and on the outside of the source line terminal 29. In other words, the metal film is removed in the vicinity of the panel cutting line 34 and at the source line terminal 29. Furthermore, the metal film formed in the formation region of the short ring line 27 and lead-out line is formed smaller than the underlying transparent conductive film. Thus, the metal film is formed on the inside of the underlying transparent conductive film pattern. Furthermore, the lead-out line has in part thereof an overlayer metal removal portion 31 formed by a single layer of the transparent conductive film. Thus, the metal film is formed outside the overlayer metal removal portion 31 in the lead-out line. The overlayer metal removal portion 31 is formed in the end portion on the side opposite the source line terminal 29 of the lead-out line.

Furthermore, the gate insulating film 15 and the passivation film 17 are successively formed on the short ring line 27 and lead-out line. The source line 5 is formed on the gate insulating film 15. The source line 5 is formed correspondingly to each source line terminal 29. The passivation film 17 is formed on the source line 5. The gate insulating film 15 and passivation film 17 are not present on the source line terminal 29. In other words, the gate insulating film 15 and passivation film 17 are formed almost entirely outside the source line terminal 29. As a result, the metal films of the lead-out line and short ring line 27 are covered by these insulating films. Furthermore, in the vicinity of the source line terminal 29, only the outer circumference of the transparent conductive film pattern is covered by the gate insulating film 15 and passivation film 17. Thus, as shown in FIG. 4, an opening of the gate insulating film 15 and passivation film 17 is formed inside the portion formed by a single layer of the transparent conductive film in the vicinity of the source line terminal 29.

A line contact hole 32a is formed inside the overlayer metal removal portion 31. Thus, the gate insulating film 15 and passivation film 17 are not present inside the overlayer metal removal portion 31. In other words, the overlayer metal removal portion 31 is formed to be larger than the line contact hole 32a. Thus, the metal film is formed outside the line contact hole 32a. In other words, the metal film is removed in the line contact hole 32a. An end portion of the metal film on the periphery of the line contact hole 32a is covered by the gate insulating film 15 and passivation film 17.

A line contact hole 32b is formed in the end portion of the source line 5 at the side of the source line terminal 29. Thus, the passivation film 17 is not present in part of the zone above the source line 5. A connection electrode 33 is then formed on the passivation film 17 from the line contact hole 32a to the line contact hole 32b. Thus, the connection electrode 33 is embedded in the line contact holes 32a and 32b. As a result, the source line 5 and lead-out line are electrically connected. Thus, the source line 5 and source line terminal 29 are electrically connected. The connection electrode 33 is formed in the same layer and from the same material as the transmissive electrode 11.

In the TFT array substrate 1 of the present embodiment, the external output terminals such as the gate line terminal 28 and source line terminal 29 do not have a metal film. As a result, the external output terminals are hardly corroded even under a corrosive environment. Furthermore, because a metal film is used for the gate line 6 and the like, signal delay hardly occurs. The short ring line 27 is formed on the periphery of the panel cutting line 34. In the present embodiment, the short ring line 27 on the periphery of the panel cutting line 34 has no metal film. Thus, no metal film is present on the periphery of the panel cutting line 34. As a result, the metal film is not exposed to the outside even when cutting is performed along the panel cutting line 34. In other words, in the TFT array substrate 1 after cutting, the short ring line 27 is formed from the terminal to the substrate end. Furthermore, the metal film that is an overlayer of the transparent conductive film is formed on the inside of the substrate end. This metal film is obviously covered by the gate insulating film 15 and passivation film 17. Therefore, corrosion hardly occurs from the line cross section in the cut section even under a corrosive environment. Because these metal films are thus covered by insulating films, the range of materials that can be used for the metal films is expanded. For example, materials that are easily corroded under an environment containing chlorine or the like can be used for the metal film. Because environmental corrosion hardly occurs on the terminal in this case, the TFT substrate 1 of the present embodiment can have a long service life.

The line contact hole 32a is formed in the overlayer metal removal portion 31. In other words, the lead-out wire is formed by a single layer of the transparent conductive film inside the line contact hole 32a. Furthermore, the connection electrode 33 is also formed by the transparent conductive film. The connection electrode 33 filling the line contact hole 32a is connected to the lead-out line formed by the single layer of the transparent conductive film. Thus, the transparent conductive films are in contact with each other and a transparent conductive film-transparent conductive film contact can be realized. As a result, the increase in contact resistance can be inhibited. Therefore, signal delay hardly occurs and power consumption can be reduced. As described herein-above, with the TFT array substrate 1 of the present embodiment, reliability can be increased.

As described hereinabove, the TFT array substrate of the present embodiment is provided with a terminal that can be connected from the outside and a transparent conductive film pattern constituting a first line extending from the terminal. The terminal is a connection terminal with the outside, such as the gate line terminal 28, source line terminal 29, common line terminal, and IC input/output terminal. For example, a transparent conductive film pattern is provided that constitutes the gate line terminal 28, gate line 6 extending from the gate line terminal 28, and gate electrode 7. The TFT array substrate is also provided with a metal film that is removed above the terminal and formed on the transparent conductive film pattern on the inside of the transparent conductive film pattern. Furthermore, the TFT array substrate is also provided with an insulating film covering the metal film. With such a configuration, reliability can be increased.

Figure 5:
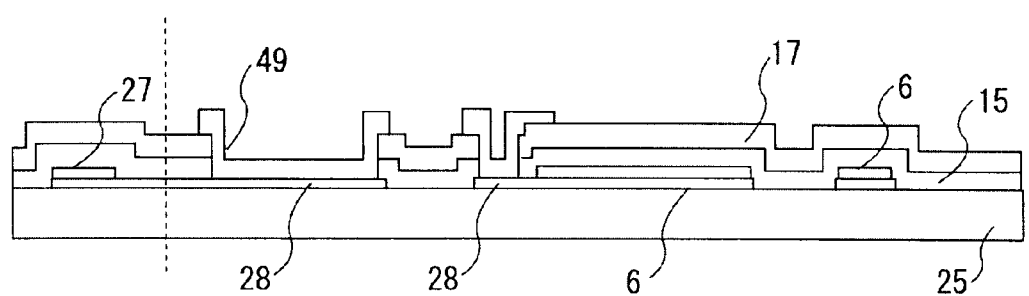
FIG. 5 is a cross-sectional view illustrating other configuration of a gate line terminal according to Embodiment 1 and a peripheral region thereof.
Figure 6A:
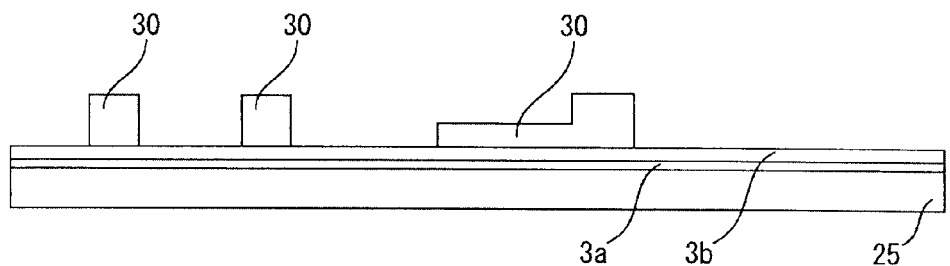
FIGS. 6A to 6C are cross-sectional views illustrating a step of manufacturing a TFT array substrate according to Embodiment 1.
Figure 6B:
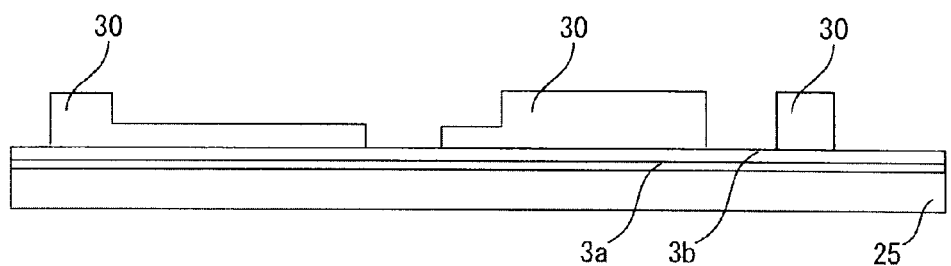
Figure 6C:
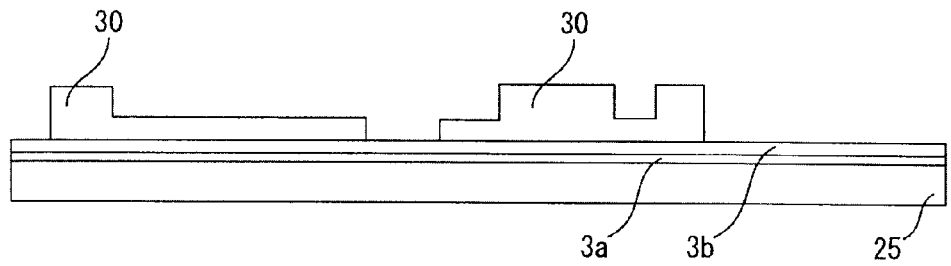

Furthermore, the gate line terminal 28 and source line terminal 29 are not necessarily formed only from a transparent conductive film of the same layer as the transparent conductive film of the gate line 6. For example, these terminals may be stacked films including a transparent conductive film of the same layer as the transparent conductive film of the gate line 6 and a transparent conductive film 49 of the same layer as the transmissive electrode 11. In such a case, the transparent conductive film 49 is formed, as shown in FIG. 5, on the gate line terminal 28. FIG. 5 is a cross-sectional view illustrating another configuration of the gate line terminal 28 and the peripheral region thereof.

The common line 12 located within the pixel 54 is not necessarily configured so that only a crossing position with the source line 5 is in the form of a stacked film including a metal film and a transparent conductive film. A portion below the pixel 54 may be also in the form of a stacked film including a metal film and a transparent conductive film to shield the light of an orientation defective region or reduce line resistance of the common line 12.

The configuration of a TFT of a channel etch type is described above, but a TFT of an etch stop type or a TFT of top gate type using polysilicon may be also used as the switching element.

A step of manufacturing the TFT array substrate 1 will be described below with reference to FIGS. 6A to 16C. FIGS. 6A to 16C are cross-sectional views illustrating the step of manufacturing the TFT array substrate 1. FIGS. 6A, 7A, 8A, 9A, 10A, 11A, 12A, 13A, 14A, 15A, and 16A illustrate the manufacturing step in the A-A section of FIG. 2. FIGS. 6B, 7B, 8B, 9B, 10B, 11B, 12B, 13B, 14B, 15B, and 16B illustrate the manufacturing step in the B-B section of FIG. 3. FIGS. 6C, 7C, 8C, 9C, 10C, 11C, 12C, 13C, 14C, 15C, and 16C illustrate the manufacturing step in the C-C section of FIG. 4.

Initially, a transparent conductive film 3a and a metal film 3b are successively formed on the insulating substrate 25 by using a sputtering method. A conductive film such as ITO, ITZO, IZO, and ITSO can be used as the transparent conductive film 3a. A metal film such as an Al alloy, a Cu alloy, a Mo alloy, an Ag alloy, and a Cr alloy can be used as the metal film 3b. Furthermore, a stacked film including a conductive layer with good contact with the transparent conductive film 3a as an underlayer and a metal film with a low resistance as an overlayer can be also used as the metal film 3b. In the present embodiment, a glass substrate is used as the insulating substrate 25, an amorphous ITO film is used as the transparent conductive film 3a, and an Al alloy film is used as the metal film 3b.

Then, in a first photoengraving step, a resist 30 having a two-stage film thickness is formed on the metal film 3b. More specifically, a thick-film resist pattern is formed on the formation regions of the gate line 6, gate electrode 7, lead-out line, common line 12, and short ring line 27. On the formation region of the lead-out line, the thick-film resist pattern is formed on the outside of the overlayer metal removal portion 31. On the formation region of the common line 12, the thick-film resist pattern is formed only in the zone of intersection with the source line 5. On the formation region of the short ring line 27, the thick-film resist pattern is formed only on the removal region 51, except the vicinity of the panel cutting line 34. Thus, the thick-film resist pattern is formed in an L-shaped portion of the short ring line 27 shown in FIG. 1.

Then, a thin-film resist pattern is formed on the formation regions of the common line 12, short ring line 27, gate line terminal 28, and source line terminal 29. A thin-film resist pattern is also formed on the overlayer metal removal portion 31. On the formation region of the common line 12 and short ring line 27, the thin-film resist pattern is formed in a portion outside a portion where the thick-film resist pattern is formed.

A method for forming a resist 30 having a two-stage film thickness will be described below. First, the resist 30, which is a photosensitive resin, is formed. Then, the resistor 30 is exposed from above a photomask. When a positive resist is used as the resist 30, the resist 30 in the formation region of the thick-film resist pattern is not exposed. The resist 30 in the formation region of the thin-film resist pattern is subjected to intermediate exposure. The resist 30 in other regions is completely exposed.

In a case where the resist 30 is exposed from above a multi-gradation mask, the exposure amount for each region of the resist 30 can be adjusted by one-cycle exposure. The multi-gradation mask as referred to herein is a photomask that can realize a three-stage exposure level including an exposure region, an intermediate exposure region, and a non-exposure region. A half tone mask and a gray tone mask are examples of the multi-gradation mask. It goes without saying that the exposure step may be also divided into an exposure step in which illumination is performed at a high quantity of light by using a usual photomask and an exposure step in which illumination is performed at a low quantity of light. The resist 30 having a two-stage film thickness is then formed by development. The above-described step produces the configuration shown in FIGS. 6A to 6C.

The metal film 3b is then etched by using the resist 30 having the thin-film resist pattern and the thick-film resist pattern as a mask. As a result, the metal film 3b is removed from the region where the resist 30 has not been formed. Furthermore, the metal film 3b is formed as a pattern that is smaller than the pattern of the resist 30. Thus, the resist 30 is formed to extend beyond the pattern of the metal film 3b. In the present embodiment, an Al alloy film serving as the metal film 3b is etched by a wet etching method using a mixture of phosphoric acid, nitric acid, and acetic acid. This etching method is not limiting, and a wet etching method using other liquid etchants or a dry etching method may be also used. Furthermore, in a case where other alloys are used as the metal film 3b, the treatment is desirably performed with a liquid etchant compatible with the respective alloy film. The above-described step produces the configuration shown in FIGS. 7A to 7C.

The resist 30 is then deformed to obtain a shape that covers edges of the etched metal film 3b. More specifically, the resist 30 is softened and a shape that covers edges of the etched metal film 3b is obtained. As a result, the finish dimensions of the transparent conductive film 3a that will be thereafter etched will not be affected by etching spread of the metal film 3b. The above-described step produces the configuration shown in FIGS. 8A to 8C.

The transparent conductive film 3a is then etched using the deformed resist 30 as a mask. As a result, the transparent conductive film 3a is patterned to have the shape almost identical to that of the pattern of the resist 30. The transparent conductive film 3a is patterned to a shape somewhat larger than that of the pattern of the overlaying metal film 3b. Thus, the metal film 3b is formed so as not to protrude beyond the pattern of the underlying transparent conductive film 3a. In the present embodiment, an ITO film serving as the transparent conductive film 3a is etched by a wet etching method using oxalic acid. This etching method is not limiting, and a wet etching method using a liquid etchant selective with respect to the overlaying metal film 3b may be used. The above-described step produces the configuration shown in FIGS. 9A to 9C.

The thin-film resist pattern of the resist 30 is then removed using a plasma ashing method. Thus, only the thick-film resist pattern is left. As a result, the metal film 3b is exposed in the formation regions of part of the common line 12, part of the short ring line 27, gate line terminal 28, and source line terminal 29. The metal film 3b is also exposed in the overlayer metal removal portion 31. The above-described step produces the configuration shown in FIGS. 10A to 10C.

The exposed metal film 3b is then etched using the remaining resist 30, that is, the thick-film resist pattern, as a mask. As a result, the transparent conductive film 3a is exposed in the formation regions of part of the common line 12, part of the short ring line 27, gate line terminal 28, and source line terminal 29. The transparent conductive film 3a is also exposed in the overlayer metal removal portion 31. In other words, the metal film 3b is formed outside the gate line terminal 28, source line terminal 29, and overlayer metal removal portion 31. The metal film 3b is also formed outside the periphery of the panel cutting line 34. The above-described step produces the configuration shown in FIGS. 11A to 11C.

The resist 30 is then removed and the gate line 6, gate electrode 7, common line 12, gate line terminal 28, source line terminal 29, lead-out line, and short ring line 27 are formed. The above-described step produces the configuration shown in FIGS. 12A to 12C.

In a case where a substrate temperature at which the amorphous ITO serving as the transparent conductive film 3a crystallizes is not reached in the subsequently performed step of forming the gate insulating film 15, annealing is performed to crystallize the ITO film. More specifically, annealing is performed after the resist 30 has been removed. It goes without saying that separate annealing is not necessary when the substrate temperature at which the amorphous ITO crystallizes is reached in the step of forming the gate insulating film 15.

The gate insulating film 15, semiconductor layer 14, and ohmic contact layer 16 are then successively formed by a plasma CVD method. These films are formed so as to cover the transparent conductive film 3a and the metal film 3b. In the present embodiment, a SiN film is used as the gate insulating film 15. An island-like resist is formed on the gate electrode 7 by a second photoengraving step. Then, the semiconductor layer 14 and ohmic contact layer 16 are etched by a dry etching method using the resist as a mask. The resist is then removed, and the semiconductor layer 14 and ohmic contact layer 16 are formed in an island-like shape. In the peripheral region of the gate line terminal 28 and source line terminal 29, the semiconductor layer 14 and ohmic contact layer 16 are completely removed. The above-described step produces the configuration shown in FIGS. 13A to 13C.

A first conductive film is then formed by using a sputtering method. A low-resistance metal film of Cr, a Mo alloy, an Al alloy, or an Ag alloy can be used as the first conductive film. Furthermore, a stacked film in which a conductive film having a good contact characteristic with the ohmic contact layer 16 is formed as an underlayer and a conductive film having a good contact characteristic with the transmissive electrode 11 is formed as an overlayer can be also used as the first conductive film. In the present embodiment, a Cr film is used as the first conductive film. Then, in the third photoengraving step, a resist for forming the source line 5, source electrode 8, and drain electrode 9 is formed on the first conductive film. The first conductive film is then etched by wet etching. The ohmic contact layer 16 of the channel 4 is then etched by dry etching. The resist is thereafter removed to form the source line 5, source electrode 8, and drain electrode 9. In the peripheral region of the gate line terminal 28, the entire first conductive film is removed. The above-described step produces the configuration shown in FIGS. 14A to 14C.

Plasma treatment with $H_2$, He, or the like is then performed to improve properties. The passivation film 17 is then formed by a plasma CVD method to cover the above-descried component. In the present embodiment, a SiN film is used as the passivation film 17. A resist for forming contact holes 13, 32a, and 32b, an opening of the gate line terminal 28, and an opening of the source line terminal 29 is then formed on the passivation film 17 by a fourth photoengraving step. The gate insulating film 15 and passivation film 17 are then etched by a dry etching method using the resist as a mask. The resist is then removed and the contact holes 13, 32a, and 32b, opening of the gate line terminal 28, and opening of the source line terminal 29 are formed.

More specifically, the passivation film 17 above the drain electrode 9 is removed and the contact hole 13 is formed. Thus, the drain electrode 9 is exposed in the contact hole 13. The gate insulating film 15 and passivation film 17 above the gate line terminal 28 and source line terminal 29 are then removed. As a result, the gate line terminal 28 and source line terminal 29 are exposed and can be connected from the outside.

The gate insulating film 15 and passivation film 17 are then removed above the lead-out line located on the inside of the overlayer metal removal portion 31, and the line contact hole 32a is formed. As a result, the transparent conductive film 3a is exposed in the line contact hole 32a. The passivation film 17 is removed above the end portion of the source line 5 and the line contact hole 32b is formed. As a result, the source line 5 is exposed in the line contact hole 32b. The gate insulating film 15 and passivation film 17 are formed so as to cover at least the metal film 3b even when these insulating films are partially removed as described hereinabove. The above-described step produces the configuration shown in FIGS. 15A to 15C.

A transparent conductive film is then formed on the passivation film 17 by a sputtering method. Furthermore, the transparent conductive film is embedded in the contact holes 13, 32a, and 32b. A resist for forming the transmissive electrode 11 and the connection electrode 33 is then formed by a fifth photoengraving method. In the present embodiment, an amorphous ITO film is used as the transparent conductive film. The transparent conductive film is then etched by using the resist as a mask. The resist is thereafter removed and the transmissive electrode 11 and the connection electrode 33 are formed.

More specifically, the transmissive electrode 11 is formed in the contact hole 13, and the transmissive electrode 11 and drain electrode 9 are electrically connected via the contact hole 13. Then, the connection electrode 33 is formed in the line contact holes 32a and 32b, and the lead-out line and source line 5 are electrically connected via the line contact holes 32a and 32b. Annealing is then performed to crystallize the amorphous ITO of the transmissive electrode 11 and connection electrode 33. The above-described step produces the configuration shown in FIGS. 16A to 16C.

The production of the TFT array substrate 1 is then completed by cutting along the panel cutting line 34. The short ring line 27 has the metal film 3b on the inside of the substrate end after cutting. Thus, the metal film 3b is not present in the cut surface of the substrate. The metal film 3b is also not present at the gate line terminal 28 and source line terminal 29. Thus, in the completed TFT array substrate 1, the metal film 3b is not exposed on the surface. As a result, reliability of the TFT array substrate 1 is increased. Furthermore, the resist 30 having a two-stage film thickness is used during patterning of the stacked film including the transparent conductive film 3a and the metal film 3b. As a result, the photoengraving can be performed in one cycle and the production step can be simplified. Productivity can thus be increased.

Figure 7A:
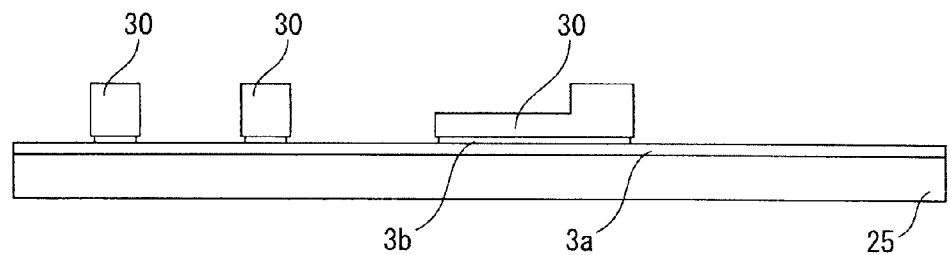
FIGS. 7A to 7C are cross-sectional views illustrating a second step of manufacturing a TFT array substrate according to Embodiment 1.
Figure 7B:
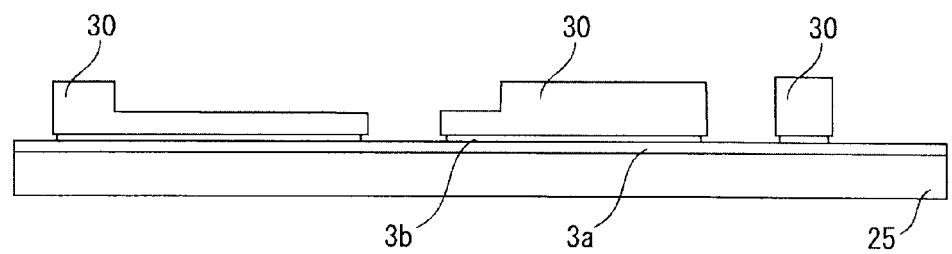
Figure 7C:
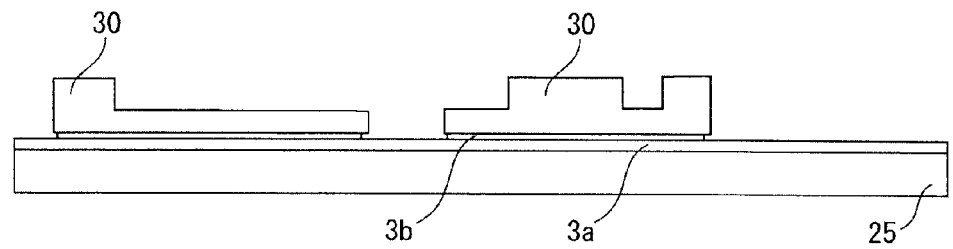
Figure 8A:
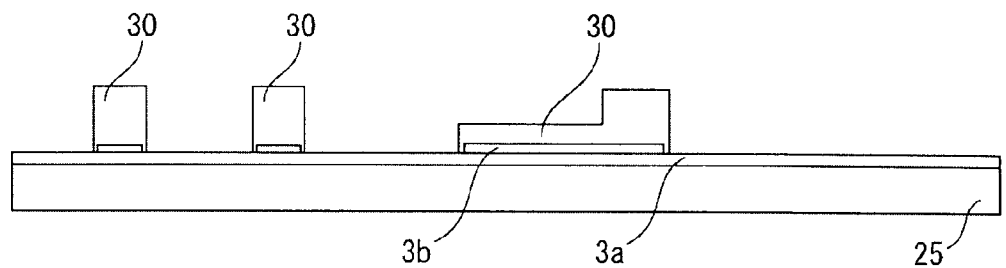
FIGS. 8A to 8C are cross-sectional views illustrating a third step of manufacturing a TFT array substrate according to Embodiment 1.
Figure 8B:
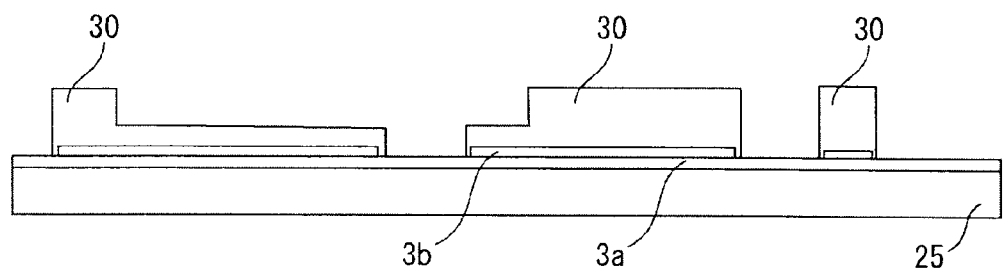
Figure 8C:
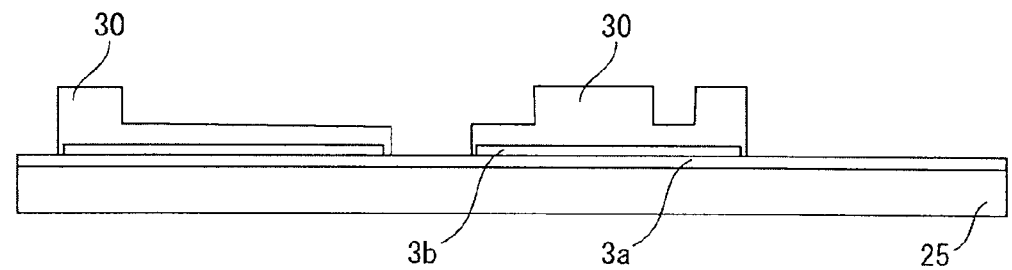
Figure 9A:
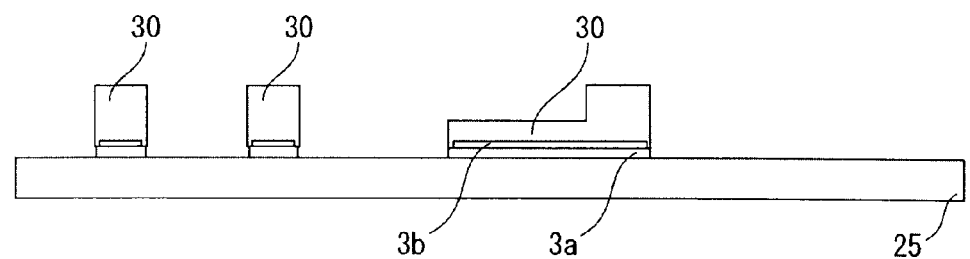
FIGS. 9A to 9C are cross-sectional views illustrating a step of manufacturing a TFT array substrate according to Embodiment 1.
Figure 9B:
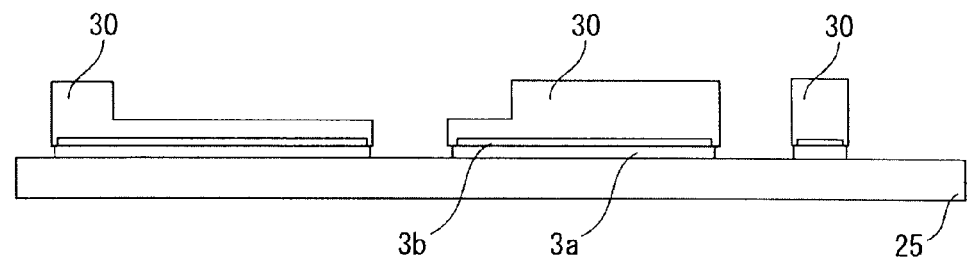
Figure 9C:
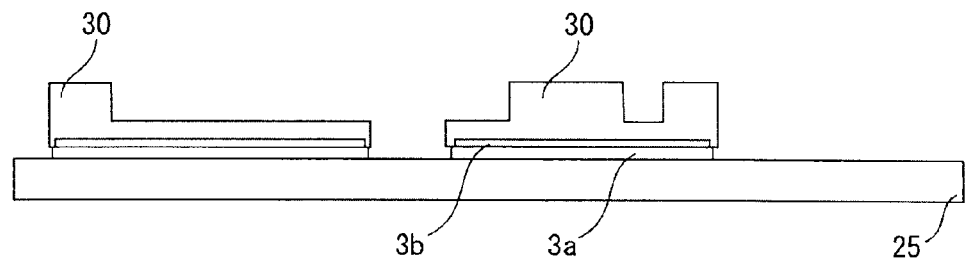
Figure 10A:
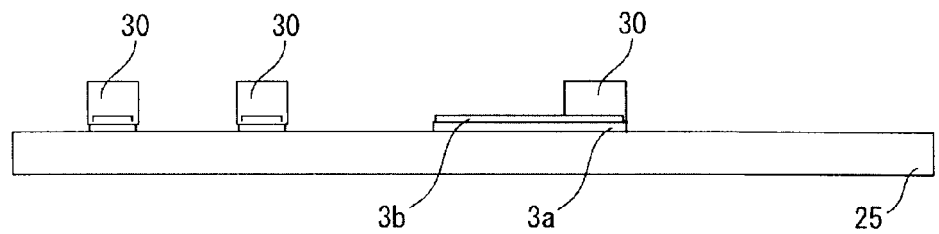
FIGS. 10A to 10C are cross-sectional views illustrating a step of manufacturing a TFT array substrate according to Embodiment 1.
Figure 10B:
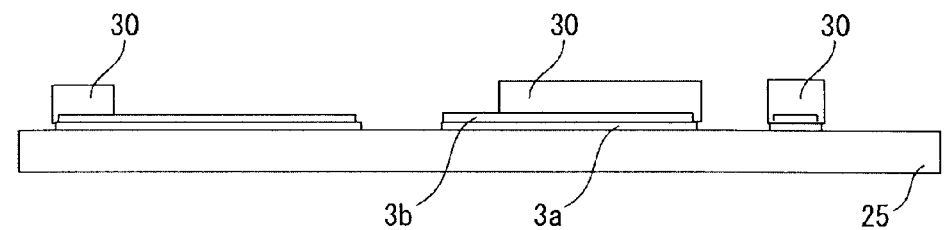
Figure 10C:
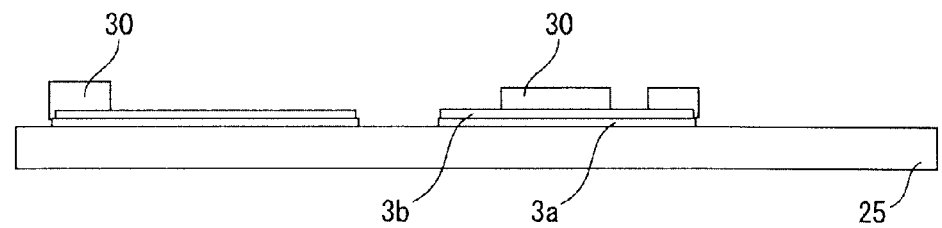
Figure 11A:
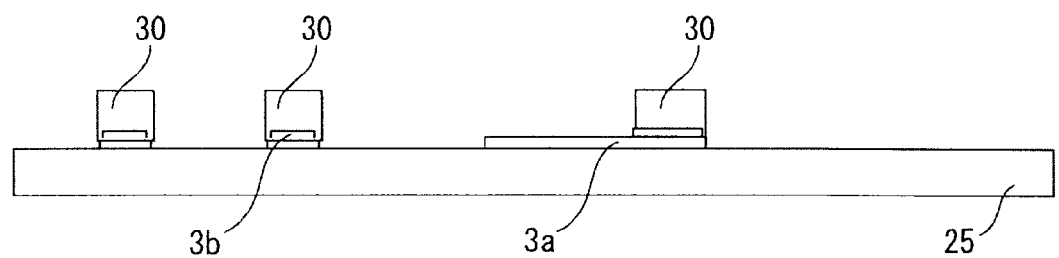
FIGS. 11A to 11C are cross-sectional views illustrating a step of manufacturing a TFT array substrate according to Embodiment 1.
Figure 11B:
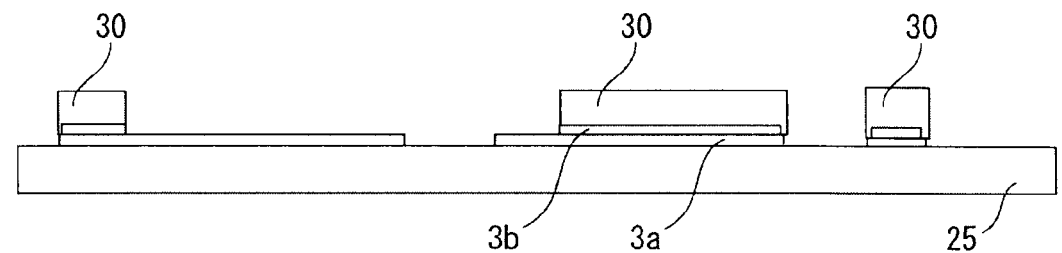
Figure 11C:
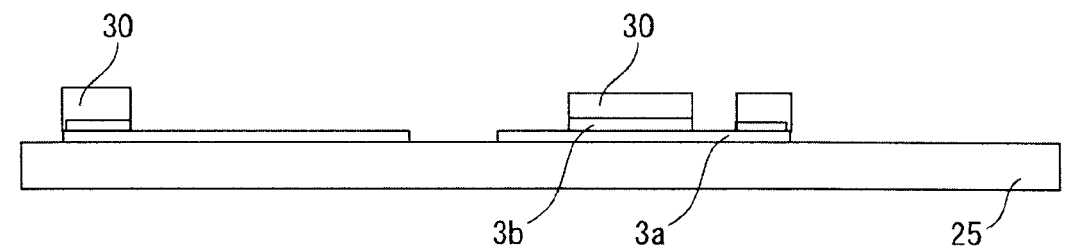
Figure 12A:
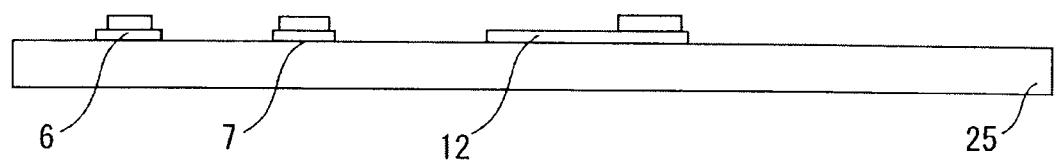
FIGS. 12A to 12C are cross-sectional views illustrating a step of manufacturing a TFT array substrate according to Embodiment 1.
Figure 12B:
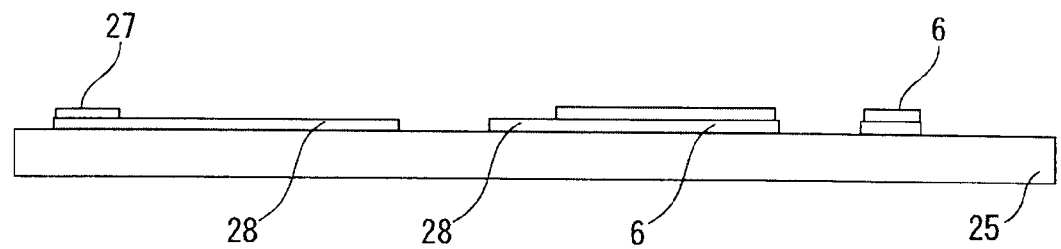
Figure 12C:
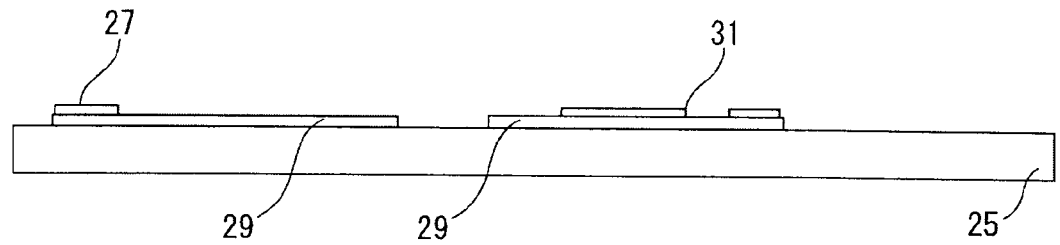
Figure 13A:
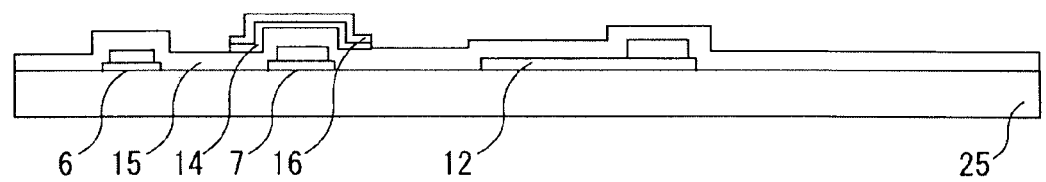
FIGS. 13A to 13C are cross-sectional views illustrating a step of manufacturing a TFT array substrate according to Embodiment 1.
Figure 13B:
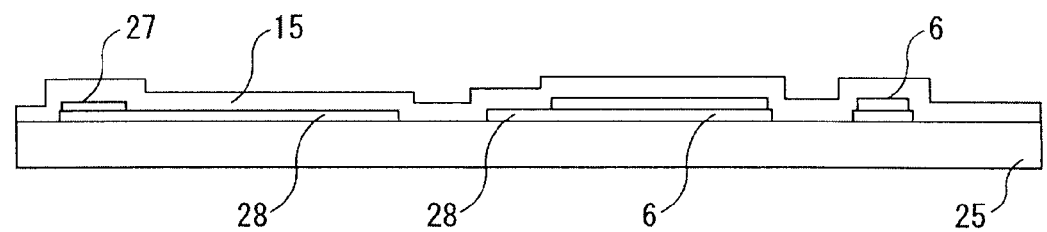
Figure 13C:
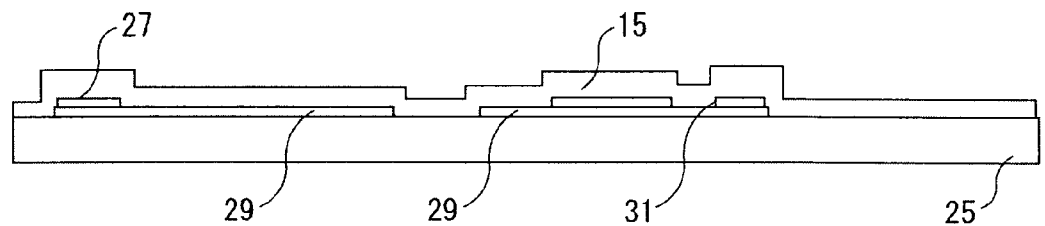
Figure 14A:
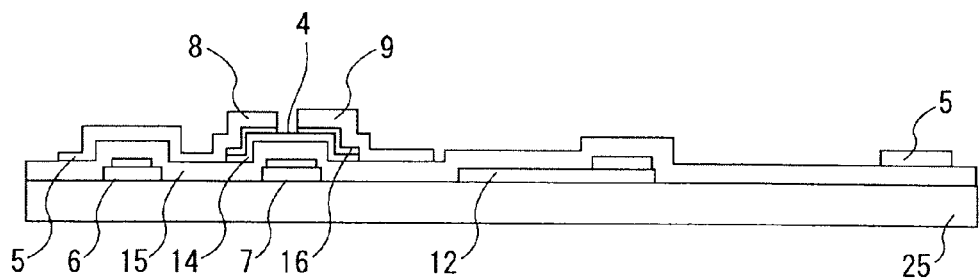
FIGS. 14A to 14C are cross-sectional views illustrating a step of manufacturing a TFT array substrate according to Embodiment 1.
Figure 14B:
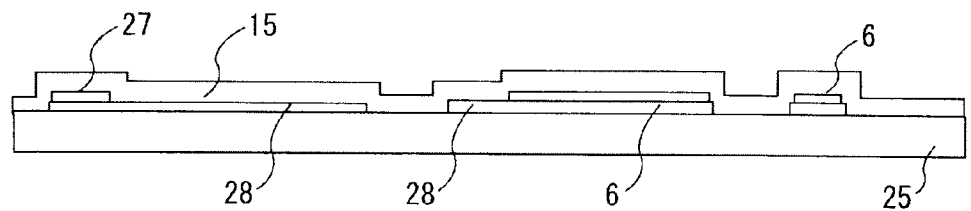
Figure 14C:
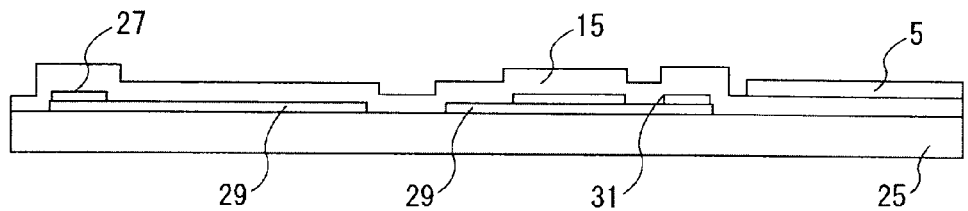
Figure 15A:
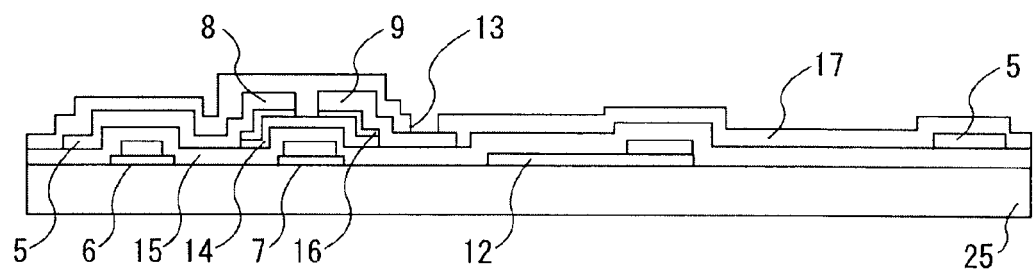
FIGS. 15A to 15C are cross-sectional views illustrating a step of manufacturing a TFT array substrate according to Embodiment 1.
Figure 15B:
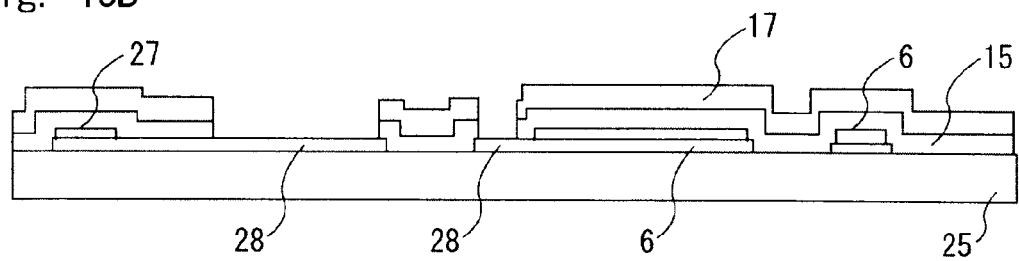
Figure 15C:
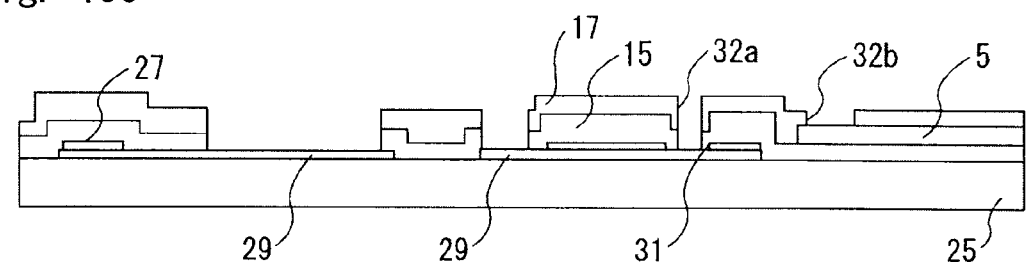
Figure 17A:
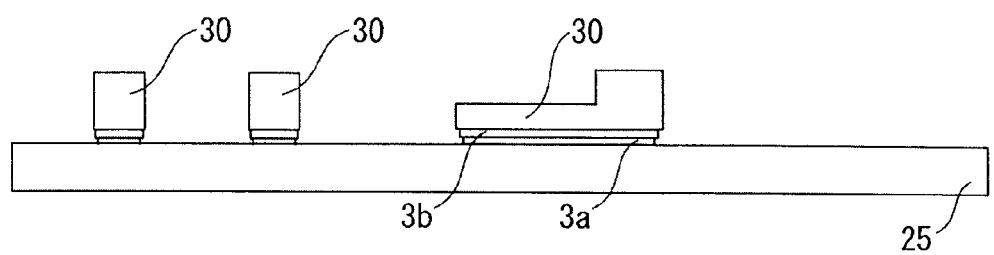
FIGS. 17A to 17C are cross-sectional views illustrating a step of manufacturing a TFT array substrate according to Embodiment 1.
Figure 17B:
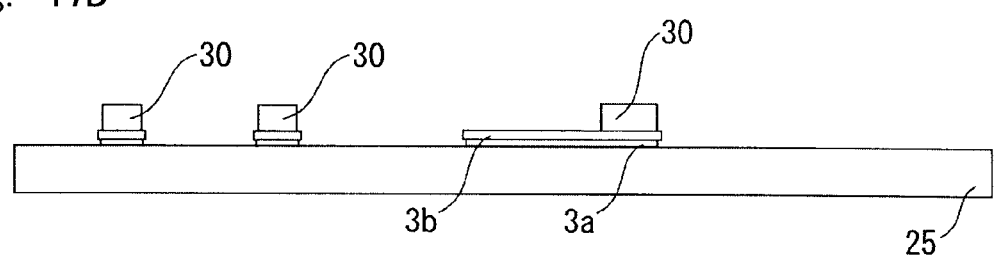
Figure 17C:
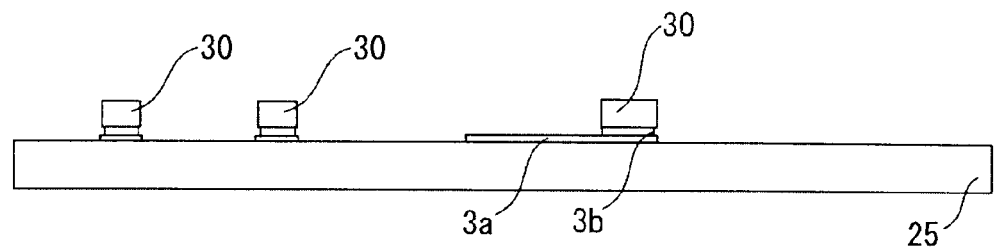

In the explanation relating to FIGS. 8A to 8C, the resist 30 is deformed, but in a case where the processing accuracy of etching is high, this process can be omitted. Thus, the transparent conductive film is successively etched after the metal film 3b has been etched, as shown in FIGS. 7A to 7C. In this case, a shape is obtained such that the edge of the metal film 3b is disposed outside the edge of the transparent conductive film 3a. As a result, the pixel 54 assumes a configuration shown in FIG. 17A. The thin-film region of the resist 30, that is, the thin-film resist pattern is then removed by a plasma ashing method. Thus, only the thick-film resist pattern is left. In this case, the shape is assumed such that the edge of the thick-film resist payer is disposed on the inside of the edge of the metal film 3b. As a result, a configuration shown in FIG. 17B is obtained. The metal film 3b is then etched by using the remaining resist 30, that is, the thick-film resist pattern, as a mask. The shape is obtained such that the edge of the metal film 3b is disposed on the inside of the edge of the transparent conductive film 3a. Thus, the metal film 3b is formed so as not to protrude beyond the pattern of the transparent conductive film 3a. As a result, the configuration shown in FIG. 17C is obtained. The TFT array substrate 1 is then produced by the same steps as shown in FIGS. 12A to 16C. The above-described step can thus be modified.

In the explanation relating to FIGS. 13A to 13C and FIGS. 14A to 14C, the semiconductor layer 14 and ohmic contact layer 16 are formed in an island-like shape and the source electrode 8 and drain electrode 9 are formed by a two-cycle photoengraving step, but such a procedure is not limiting. For example, these elements may be also formed by a one-cycle photoengraving step using a multi-gradation mask. More specifically, a thick-film resist pattern is formed in the formation regions of the source electrode 8 and drain electrode 9, and a thin-film resist pattern is formed in the formation region of the channel 4. The semiconductor layer 14, ohmic contact layer 16, source electrode 8, and drain electrode 9 may be formed by etching using such a resist pattern having a two-stage film thickness as a mask.

Figure 18A:
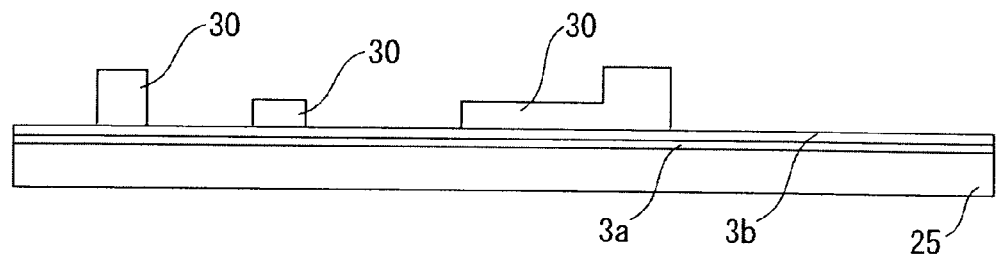
FIGS. 18A to 18D are cross-sectional views illustrating a step of manufacturing a TFT array substrate according to Embodiment 1.
Figure 18B:
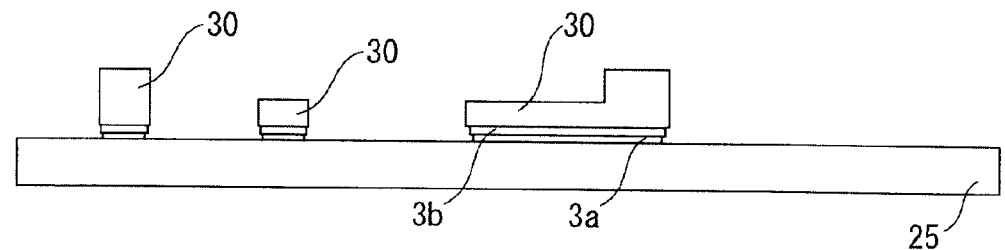
Figure 18C:
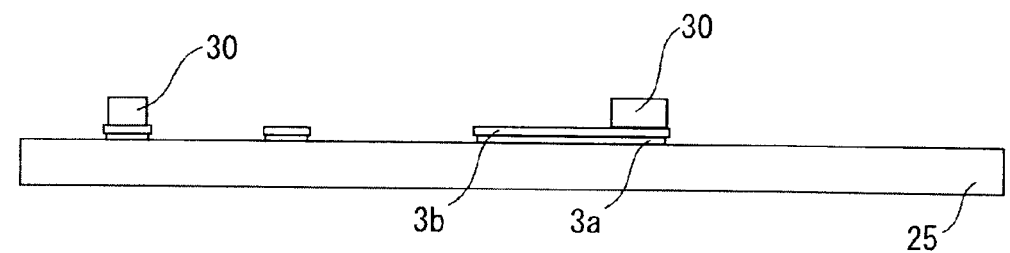
Figure 18D:
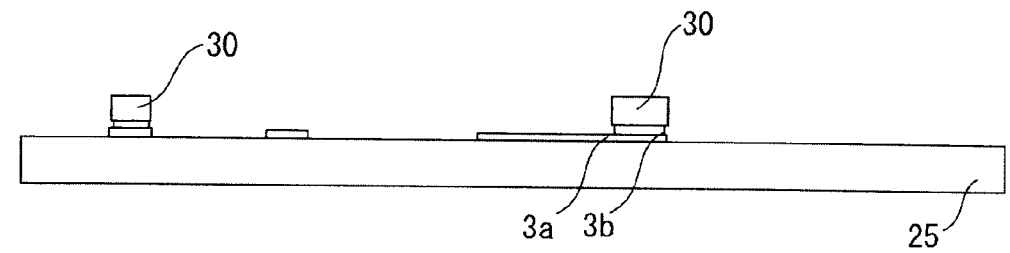

In devices with small effect of light leak caused by back surface light, the gate electrode 7 is formed by a stacked film of the metal film 3b and transparent conductive film 3a, but the gate layer may be also formed from a single layer of the transparent conductive film 3a. More specifically, in the step illustrated by FIG. 6A, a thin-film resist pattern is formed in the formation region of the gate electrode 7 where the thick-film resist pattern has been formed. As a result, the pixel 54 has a configuration shown in FIG. 18A. Then, as shown in FIGS. 18B to 18D, the gate electrode 7 is also formed from a single layer of the transparent conductive film 3a by performing ashing and etching. In the step illustrated by FIGS. 18B to 18D, the aforementioned elements are formed by a method using no deformation of the resist 30, as in the step illustrated by FIGS. 17B and 17C, but it is also possible to deform the resist 30.

Embodiment 2

In the present embodiment, a TFT array 1 for use in a liquid crystal display device of a fringe field (FFS) drive will be explained. More specifically, the shape of a common line 12 and the shape of a transmissive electrode 11 are different from those of Embodiment 1. A lower pixel electrode 35 of the present embodiment corresponds to the common line 12 of Embodiment 1. Other elements such as a gate line terminal 28, a source line terminal 29, and a short ring line 27 and manufacturing steps are similar to those of Embodiment 1. Thus, the features of the present embodiment are similar to those of the embodiment illustrated by FIGS. 1, 3, and 4. Furthermore, in the present embodiment, the TFT array substrate 1 is also produced by the manufacturing steps illustrated by FIGS. 6B, 7B, 8B, 9B, 10B, 11B, 12B, 13B, 14B, 15B, 16B, 6C, 7C, 8C, 9C, 10C, 11C, 12C, 13C, 14C, 15C, and 16C. Accordingly, the explanation common to Embodiment 1 will be simplified or omitted.

Figure 19:
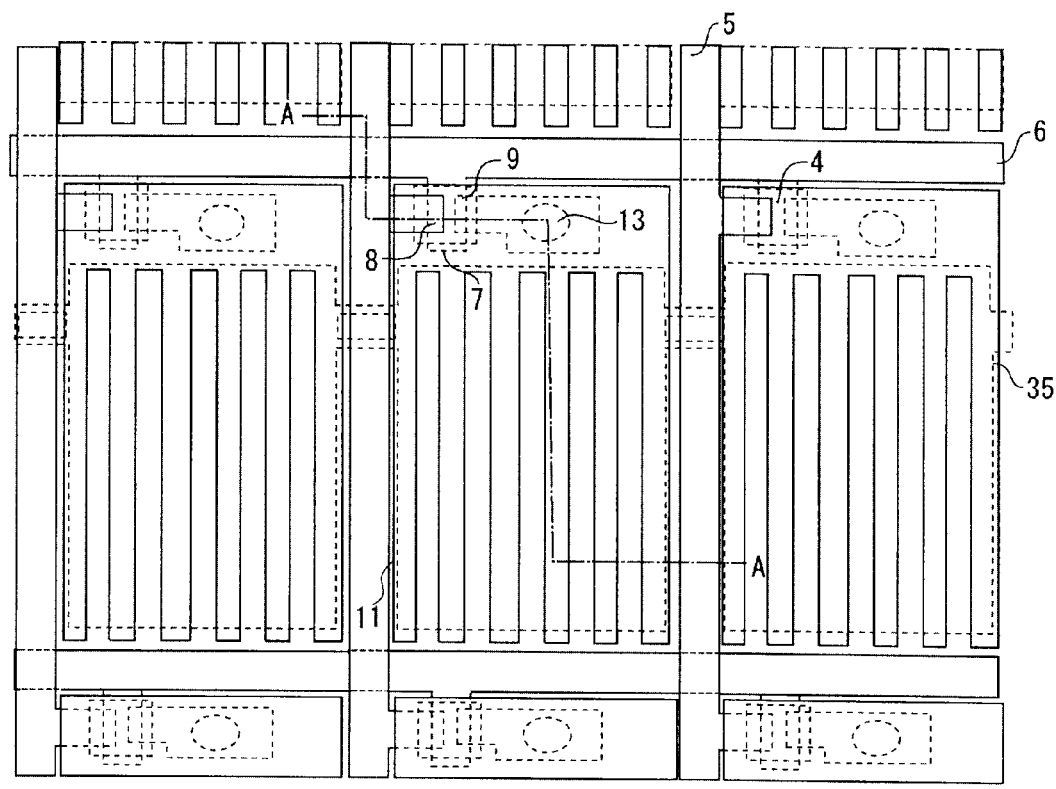
FIG. 19 is a plan view illustrating the configuration of a TFT array substrate according to Embodiment 2.
Figure 20A:
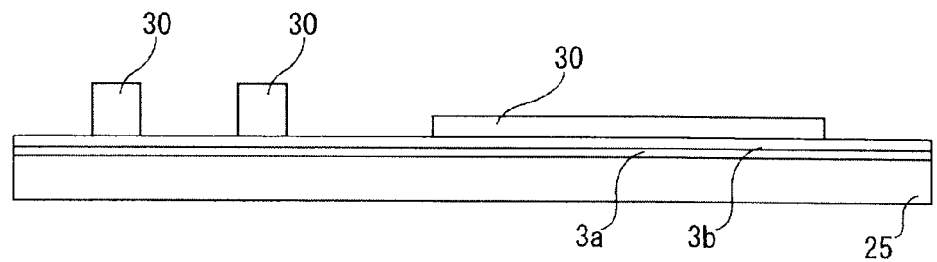
FIGS. 20A and 20B are cross-sectional views illustrating a step of manufacturing a TFT array substrate according to Embodiment 2.
Figure 20B:
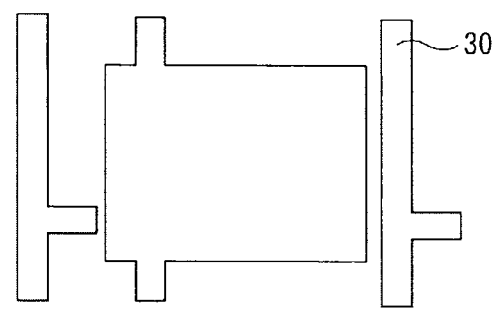
Figure 21A:
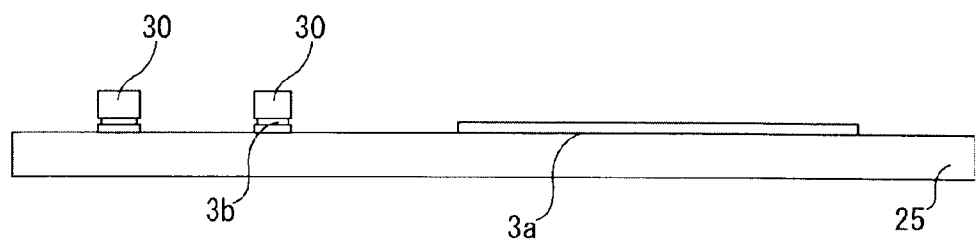
FIGS. 21A and 21B are cross-sectional views illustrating a step of manufacturing a TFT array substrate according to Embodiment 2.
Figure 21B:
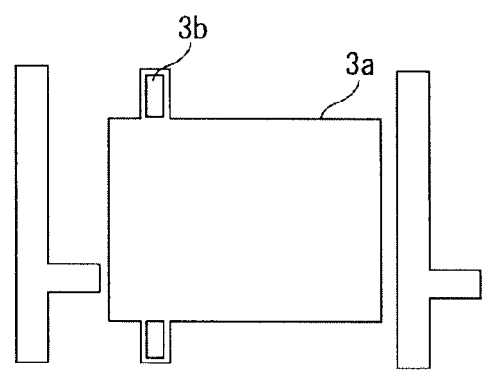
Figure 22A:
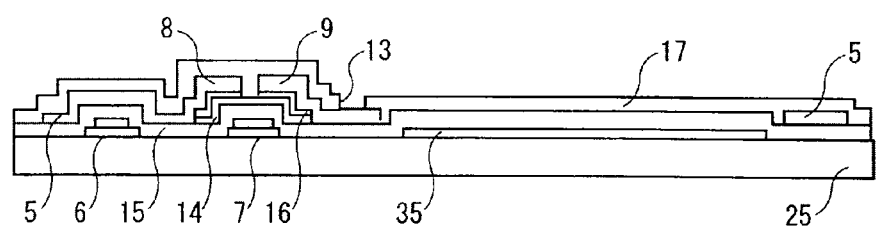
FIGS. 22A and 22B are cross-sectional views illustrating a step of manufacturing a TFT array substrate according to Embodiment 2.
Figure 22B:
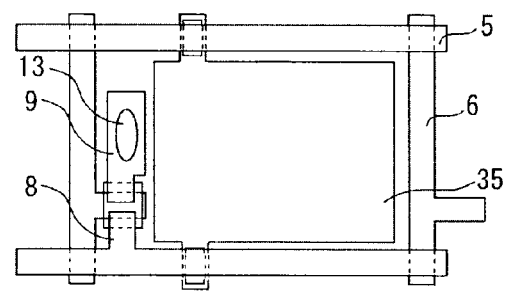
Figure 23A:
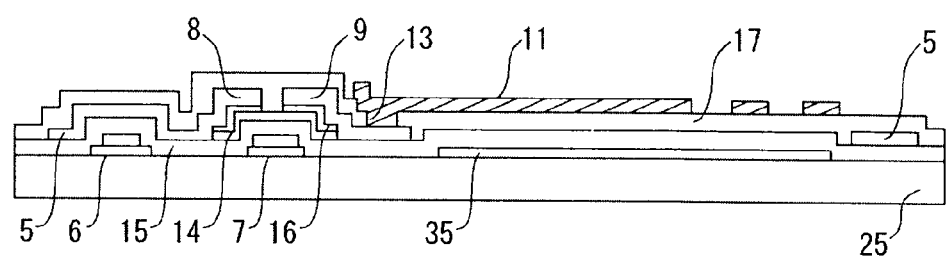
FIGS. 23A and 23B are cross-sectional views illustrating a step of manufacturing a TFT array substrate according to Embodiment 2.
Figure 23B:
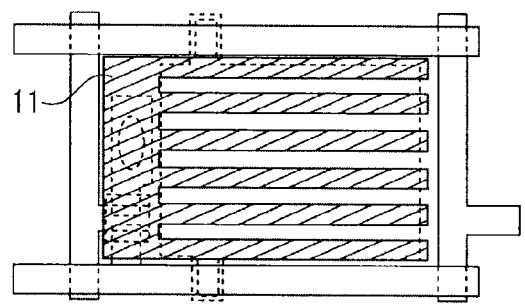

The configuration of the TFT array substrate 1 of the present embodiment will be described below with reference to FIG. 19 and FIG. 23A. FIG. 19 is a plan view illustrating the configuration of a pixel 54 of the TFT array substrate 1. FIG. 23A is an A-A sectional view of the configuration shown in FIG. 19.

In the TFT array substrate 1, the lower pixel electrode 35 is formed in almost the entire pixel. Thus, the lower pixel electrode 35 is formed in almost the entire region surrounded by the adjacent gate lines 6 and adjacent source lines 5. In this case, the lower pixel electrode 35 functions as an opposite electrode. Thus, an opposite electrode is not formed on the opposite substrate.

Furthermore, the lower pixel electrodes 35 of pixels adjacent in the extension direction of the gate line 6 are connected in almost central portions of the pixels. Thus, part of the lower pixel electrode 35 crosses the source line 5. In the portion crossing the source line 5, the lower pixel electrode 35 has a two-layer structure obtained by successive lamination of a transparent conductive film and a metal film. In a portion overlapping a transmissive electrode 11, the lower pixel electrode 35 is configured by a single layer of a transparent conductive film. Furthermore, similarly to Embodiment 1, the gate line 6 and gate electrode 7 have a two-layer structure obtained by successive lamination of a transparent conductive film and a metal film.

The transmissive electrode 11 is formed in a comb-tooth shape. More specifically, the transmissive electrode 11 has six comb-tooth electrodes formed along the source line 5. The six comb-tooth electrodes are formed parallel to each other. The transmissive electrode 11 and lower pixel electrode 35 overlap via a gate insulating film 15 and a passivation film 17. In this case, the transmissive electrode 11 is formed above the lower pixel electrode 35. Furthermore, the lower pixel electrode 35 is present in regions between all the comb-tooth electrodes. An electric field corresponding to a display voltage is generated between the end portions of the comb-tooth electrodes of the transmissive electrode 11 and the lower pixel electrode 35. An electric field is generated from the transmissive electrode 11 along the underlying lower pixel electrode 35 on both sides of the comb-tooth electrodes of the transmissive electrode 11. More specifically, a fringe electric field is generated in the direction oblique to the substrate surface. Liquid crystal molecules are driven and display is performed using this fringe electric field. The effect that can be demonstrated by the TFT array substrate 1 of the present embodiment is similar to that of Embodiment 1.

A step of manufacturing the TFT array substrate 1 of the present embodiment will be explained below with reference to FIGS. 20A to 23B. FIGS. 20A to 23B illustrate the step of manufacturing the TFT array substrate 1. FIGS. 20A, 21A, 22A, and 23A are cross-sectional views illustrating the step of manufacturing the TFT array substrate 1 in the A-A section in FIG. 19. FIGS. 20B, 21B, 22B, and 23b are plan views illustrating the step of manufacturing the TFT array substrate 1 in pixels.

Similarly to Embodiment 1, first, a transparent conductive film 3a and a metal film 3b are successively formed on an insulating substrate 25. Then, a resist 30 having a two-stage film thickness is formed by a first photoengraving step. More specifically, a thick-film resist pattern is formed on formation regions of the gate line 6, gate electrode 7, and lower pixel electrode 35. On the formation region of the lower pixel electrode 35, the thick-film resist pattern is formed only in the crossing portion with the source line 5. A thin-film resist pattern is then formed on the portion other than the portion where the thick-film resist pattern is formed on the formation region of the lower pixel electrode 35. The above-described step produces the configuration shown in FIGS. 20A and 20B.

The metal film 3b is then etched using the resist 30 as a mask. As a result, the metal film 3b located in the region where the resist 30 has not been formed is removed. The resist 30 is then deformed, that is, softened, to obtain a shape that covers the edge of the etched metal film 3b. The transparent conductive film 3a is then etched using the resist 30 as a mask. The thin-film resist pattern of the resist 30 is thereafter removed using a plasma ashing method. Thus, only the thick-film resist pattern is left. As a result, the metal film 3b is exposed in part of the formation region of the lower pixel electrode 35. The exposed metal film 3b is then etched using the remaining resist 30, that is, the thick-film resist pattern, as a mask. As a result, the transparent conductive film 3a is exposed in part of the formation region of the lower pixel electrode 35. Thus, the transparent conductive film 3a is exposed in the formation region of the lower pixel electrode 35 inside the pixel. The above-described step produces the configuration shown in FIGS. 21A and 21B.

The resist 30 is then removed, and the gate line 6, gate electrode 7, and lower pixel electrode 35 are formed. A gate insulating film 15, a semiconductor layer 14, an ohmic contact layer 16, a source electrode 8, a drain electrode 9, and a source line 5 are then formed by a method similar to that of Embodiment 1. The passivation film 17 is then formed by a plasma CVD method. A resist for forming an opening of a contact hole 13 is then formed by a fourth photoengraving step. The passivation film 17 is thereafter etched by a dry etching method using the resist as a mask. The resist is then removed and the contact hole 13 is formed. More specifically, the passivation film 17 located above the drain electrode 9 is removed and the contact hole 13 is formed. Thus, the drain electrode 9 is exposed in the contact hole 13. The above-described step produces the configuration shown in FIGS. 22A and 22B.

A transparent conductive film is then formed by using a sputtering method. A resist for forming the transmissive electrode 11 is then formed by a fifth photoengraving step. In the present embodiment, an amorphous ITO film is used as the transparent conductive film. The transparent conductive film is then etched using the resist as a mask. The resist is then removed and the transmissive electrode 11 is formed. In this case, the transmissive electrode is formed to have a comb-tooth shape by modifying the pattern of Embodiment 1. Annealing is then performed to crystallize the amorphous ITO of the transmissive electrode 11. The above-described step produces the configuration shown in FIGS. 23A and 23B.

Thus, with the above-described configuration, the TFT array substrate 1 can be produced without adding a new step of forming the lower pixel electrode 35. Therefore the process is simplified and productivity is increased.

Embodiment 3

In the present embodiment a TFT array substrate 1 for use in a liquid crystal display of a transflective type will be explained. More specifically, the configurations of a common line 12 and a pixel electrode are different from those of Embodiment 1. Other basic features and manufacturing steps are similar to those of Embodiment 1. Furthermore, in the present embodiment, the TFT array substrate 1 also has a configuration similar to that shown in FIG. 1. Accordingly, explanation common to that of Embodiment 1 will be omitted or simplified.

Figure 24:
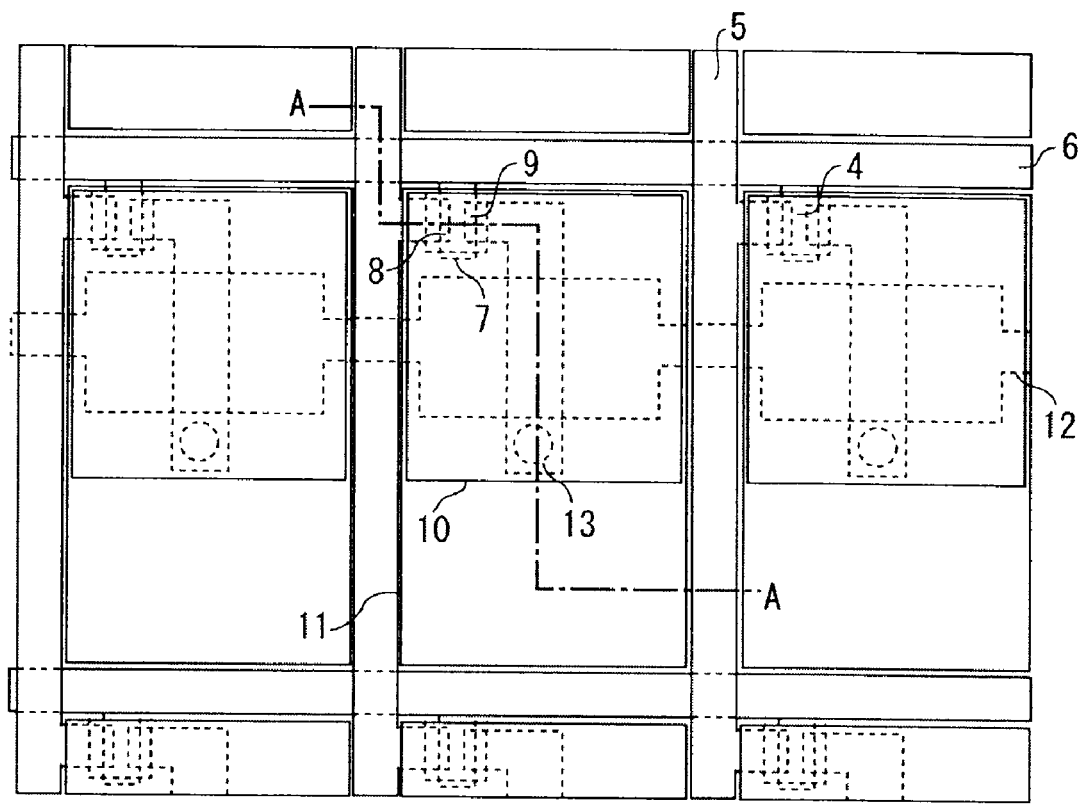
FIG. 24 is a plan view illustrating the configuration of a pixel according to Embodiment 3.
Figure 25:
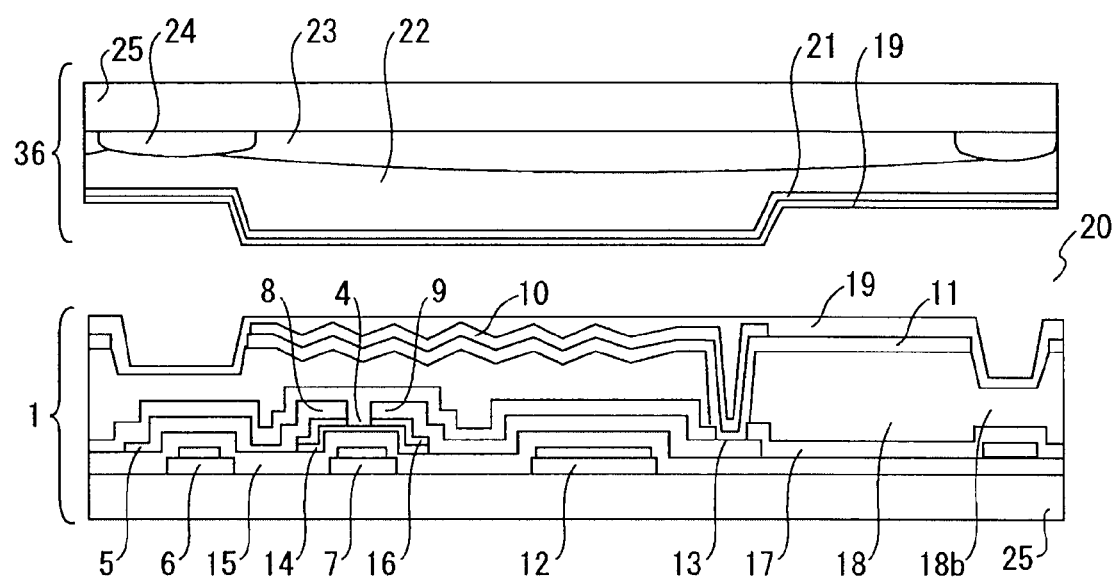
FIG. 25 is an A-A sectional view of the configuration shown in FIG. 24.
Figure 26A:
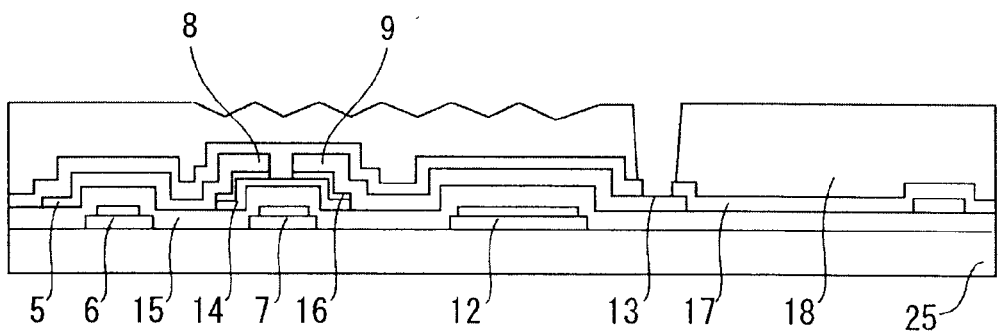
FIGS. 26A to 26C are cross-sectional views illustrating a step of manufacturing a TFT array substrate according to Embodiment 3.
Figure 26B:
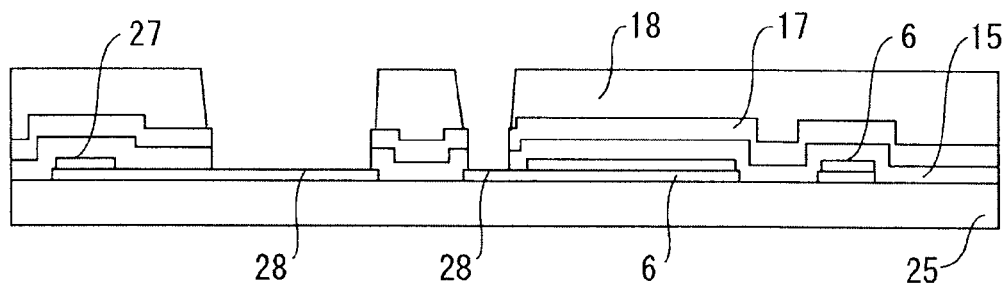
Figure 26C:
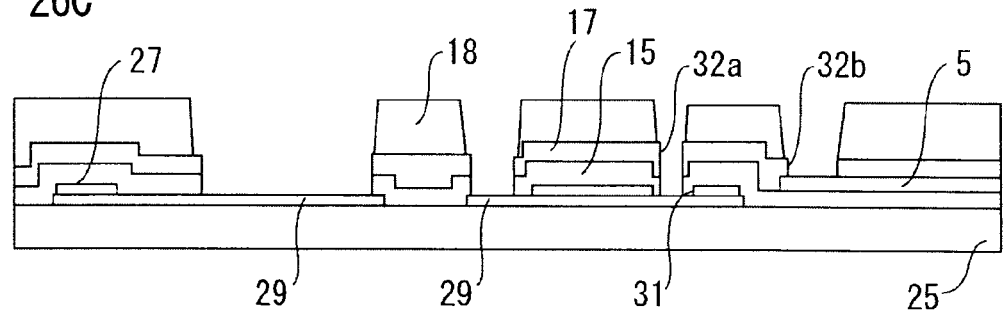

A pixel configuration of the TFT array substrate 1 of the present embodiment will be explained below with reference to FIGS. 24 and 25. FIG. 24 is a plan view illustrating a pixel configuration of the TFT array substrate 1. FIG. 25 is an A-A sectional view of the configuration shown in FIG. 24. FIG. 25 also shows an opposite substrate that is disposed opposite the TFT array substrate 1 and a liquid crystal 20 formed between the two substrates. In this case, a color filter substrate 36 is used as the opposite substrate.

A pixel has a transmissive region and a reflective region. The transmissive region is formed in almost half the pixel on the side opposite the TFT. The reflective region is formed in almost half of the pixel on the TFT side. A common line 12 and the TFT are formed in the reflective region. The common line 12 has a shape similar to that in Embodiment 1, but by contrast with Embodiment 1, has a two-layer structure in which a transparent conductive film 3a and a metal film 3b are successively stacked in almost the entire common line 12. The common line 12 constitutes a capacity such that a drain electrode 9 and a reflective electrode 10 described hereinbelow retain a liquid crystal 20. As shown in FIG. 24, the drain electrode 9 extends from above a gate electrode 7 along a source line 5 almost to the central portion of the pixel. The drain electrode 9 is formed so as to stride over the common line 12.

A passivation film 17 is formed to cover the TFT. A planarizing film 18 is formed on the passivation film 17. In the reflective region, the planarizing film 18 has a peak-valley shape at the interface with the overlayer transmissive electrode 11. Thus, the planarizing film 18 has a peak-valley shape above the common line 12 and the TFT. As a result, a reflected light in the reflective region can be provided with adequate scattering distribution. Furthermore, in a formation region of a pixel electrode, the planarizing film 18 has a large thickness, and in other region the thickness of the planarizing film 18 is less than that in the formation region of a pixel electrode. Thus, the thickness of the planarizing film 18 is small in the formation regions of a gate line 6 and a source line 5. A contact hole 13 is formed in the passivation film 17 and planarizing film 18 above the drain electrode 9. Furthermore, the contact hole 13 is formed at the end portion of the drain electrode 9 on the side opposite the gate electrode 7. The contact hole 13 is formed in the end portion of the reflective region.

A pixel electrode is formed on the planarizing film 18. The pixel electrode has a transmissive region and a reflective region and is configured by a transmissive electrode 11 and a reflective electrode 10. The transmissive electrode 11 is formed over almost the entire pixel. Thus, the transmissive electrode 11 is formed in the transmissive region and reflective region. The transmissive electrode 11 is embedded in the contact hole 13. The transmissive electrode 11 and drain electrode 9 are electrically connected by the contact hole 13. The reflective electrode 10 is formed on the transmissive electrode 11 of the reflective region outside the transmissive region. The reflective electrode 10 is formed on peaks and valleys of the planarizing film 18. Thus, in the transmissive region, the pixel electrode is configured by a single layer of the transmissive electrode 11. Furthermore, in the reflective region, the pixel electrode has a stacked structure of the transmissive electrode 11 and reflective electrode 10. An oriented film 19 is formed over the entire substrate so as to cover the transmissive and reflective electrodes. The TFT array substrate 1 is thus configured.

A color filter substrate 36 is disposed opposite the TFT array substrate 1. The color filter substrate 36 has a black matrix (BM) 24, color materials 23, an overcoat 22, an opposite electrode 21, and the oriented film 19. The BM 24 and the color materials 23 are formed below an insulating substrate 25. The BM 24 is formed on the gate line 6 and source line 5. Thus, the BM 24 is formed in a grid-like shape. The color materials 23 are, for example, R (red), B (blue), and G (green) color materials and are formed for each pixel. Thus, the color materials 23 are formed in a portion where BM 24 is not formed.

The overcoat 22 is formed to cover the BM 24 and color materials 23. In the transmissive region, the overcoat 22 has a small thickness. In the reflective region, the overcoat 22 has a large thickness. Thus, the thickness of the overcoat 22 is larger above the reflective electrode 10. Therefore, the distance between the two substrates in the reflective region is less than the distance between the two substrates in the transmissive region. The opposite electrode 21 and the oriented film 19 are successively formed so as to cover the overcoat 22. The color filter substrate 36 has the above-described configuration. The space between the two substrates is filled with the liquid crystal 20.

Figure 30A:
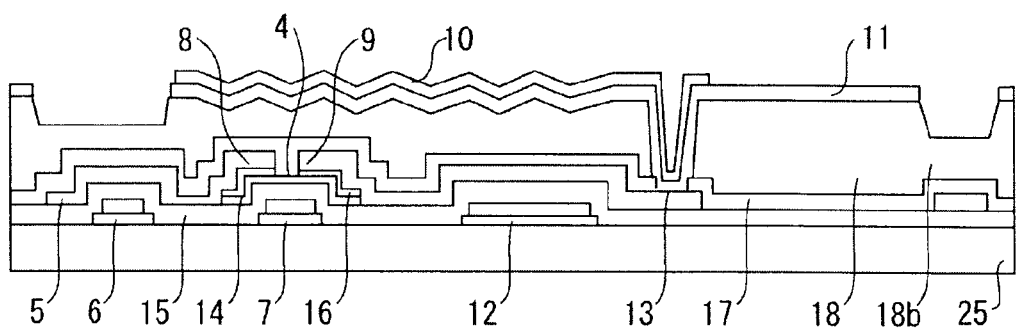
FIGS. 30A to 30C are cross-sectional views illustrating a step of manufacturing a TFT array substrate according to Embodiment 3.
Figure 30B:
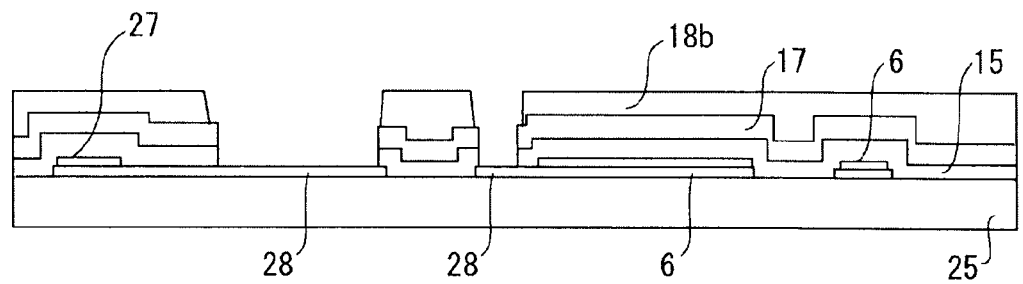

A gate line terminal 28 and a peripheral region thereof will be explained below with reference to FIG. 30B. FIG. 30B is a cross-sectional view illustrating the gate line terminal 28 and the peripheral region thereof.

The gate line terminal 28 and the peripheral region thereof have a configuration similar to that shown in Embodiment 1. Furthermore, in the present embodiment, the passivation film 18 is formed on the passivation film 17. The planarizing film 18 is formed in a portion shared by the underlying passivation film 17 and gate insulating film 15. In other words, the gate insulating film 15, passivation film 17, and planarizing film 18 are not present on the gate line terminal 28, and the gate line terminal 28 is exposed. Furthermore, the outer periphery of the transparent conductive film pattern in the vicinity of the gate line terminal 28 is covered by the gate insulating film 15, passivation film 17, and planarizing film 18. In the gate line terminal 28 and the peripheral region thereof, the thickness of the planarizing film 18 is small. In the figures referred to hereinbelow, including FIG. 30B, the planarizing film with a small thickness will be denoted by a reference symbol 18b.

Figure 30C:
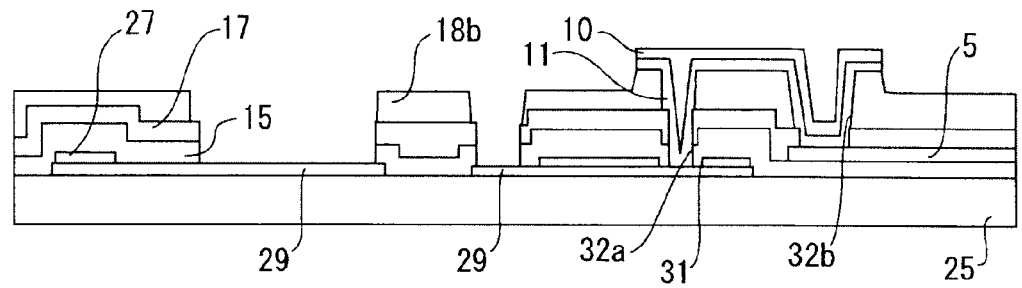

The source line terminal 29 and the peripheral region thereof will be explained below with reference to FIG. 30C. FIG. 30C is a cross-sectional view illustrating the source line terminal 29 and the peripheral region thereof.

The source line terminal 29, short ring line 27, source line 5, gate insulating film 15, and passivation film 17 are formed on the insulating substrate 25. These components have configurations similar to those of Embodiment 1. The planarizing film 18 is formed on the passivation film 17. The planarizing film 18 is formed in a portion shared with the underlying passivation film 17. In other words, the gate insulating film 15, passivation film 17, and planarizing film 18 are not present on the source line terminal 29, and the source line terminal 29 is exposed. Furthermore, the outer periphery of the transparent conductive film pattern in the vicinity of the source line terminal 29 is covered by the gate insulating film 15, passivation film 17, and planarizing film 18.

In the line contact hole 32*a* located on the inside of the overlayer metal removal portion 31, the gate insulating film 15, passivation film 17, and planarizing film 18 are not present. In the line contact hole 32*b*, the passivation film 17 and planarizing film 18 are not present. A connection electrode has a two-layer structure in which the transmissive electrode 11 and the reflective electrode 10 are successively stacked. The connection electrode is embedded in the line contact holes 32*a* and 32*b*, thereby connecting the lead-out line and the source line 5. The planarizing film 18 underlying the connection electrode has a large thickness. Other portions of the planarizing film 18 have a small thickness.

The effect that can be demonstrated with the TFT array substrate 1 of the present embodiment is similar to that of Embodiment 1. Furthermore, in a case where the TFT array substrate 1 is used in a liquid crystal display device of a transflective type, the common line 12 is formed in the reflective region. Therefore, within the pixel, the common line 12 has a two-layer structure in which the transparent conductive film and the metal film are successively stacked. Thus, the common line 12 also has the metal film in the pixel. As a result, the occurrence of common signal delay is prevented.

The planarizing film 18 is not necessarily formed in a portion that is almost shared with the underlying gate insulating film 15 or the passivation film 17. The planarizing film 18 at the end portion of terminal, terminal periphery, and periphery of the panel cutting line may be removed when the planarizing film 18 is formed or when the pixel electrode is formed.

A step of manufacturing the TFT array substrate 1 of the present embodiment will be described below with reference to FIGS. 26A to 30C. FIGS. 26A to 30C are cross-sectional views illustrating the step of manufacturing the TFT array substrate 1. Furthermore, FIGS. 26A, 27A, 28A, 29A, and 30A illustrate the manufacturing step in the A-A sectional view of FIG. 24. FIGS. 26B, 27B, 28B, 29B, and 30B illustrate the manufacturing step of the gate line terminal 28 and the peripheral region thereof. FIGS. 26C, 27C, 28C, 29C, and 30C illustrate the manufacturing step of the source line terminal 29 and the peripheral region thereof.

The manufacturing step up to the formation of the source electrode 8, drain electrode 9, and source line 5 is similar to that of Embodiment 1. As described hereinabove, almost the entire common line 12 in the present embodiment has a two-layer structure including the transparent conductive film and metal film. As a result, a resist shape is obtained in which the metal film of the common line 12 is not removed. The passivation film 17 and planarizing film 18 are then successively formed to cover the aforementioned components. The planarizing film 18 is then patterned by a fourth photoengraving step.

More specifically, the planarizing film 18 of the reflective region is partially exposed and developed. As a result, peaks and valleys are formed in the planarizing film 18 of the reflective region. In the same step, openings are formed in the planarizing film 18 in the formation regions of the contact holes 13, 32*a*, and 32*b*, gate line terminal 28, and source line terminal 29. Thus, the planarizing film 18 is removed in these formation regions. The passivation film 17 and the gate insulating film 15 are then etched by a dry etching method by using the patterned planarizing film 18 as a mask. As a result, the contact holes 13, 32*a*, and 32*b*, the opening of the gate line terminal 28, and the opening of the source line terminal 29 are formed similarly to Embodiment 1. The above-described step produces the configuration shown in FIGS. 26A to 26C.

The transparent conductive film 49 and the reflective film 50 for the transmissive electrode are then successively formed on the planarizing film 18 by using a sputtering method. The transparent conductive film 49 and the reflective film 50 are embedded in the contact holes 13, 32*a*, and 32*b*. A transparent conductive film such as ITO, ITSO, and IZO can be used as the transparent conductive film 49. A highly reflective metal such as an Al alloy or an Ag alloy can be used for the reflective film 50. A stacked film having a contact metal as an underlayer can be also used as the reflective film 50. In addition, a thin transparent conductive film may be stacked on the uppermost layer of the reflective film 50 for burn-in prevention. In the present embodiment, amorphous ITO is used as the transparent conductive film 49, and an Al alloy is used as the reflective film 50. The resist 30 having a two-stage film thickness is then formed on the formation regions of the pixel electrode and the connection electrode by a fifth photoengraving step. The resist 30 is not formed on other regions including the gate line terminal 28 and source line terminal 29.

Figure 27A:
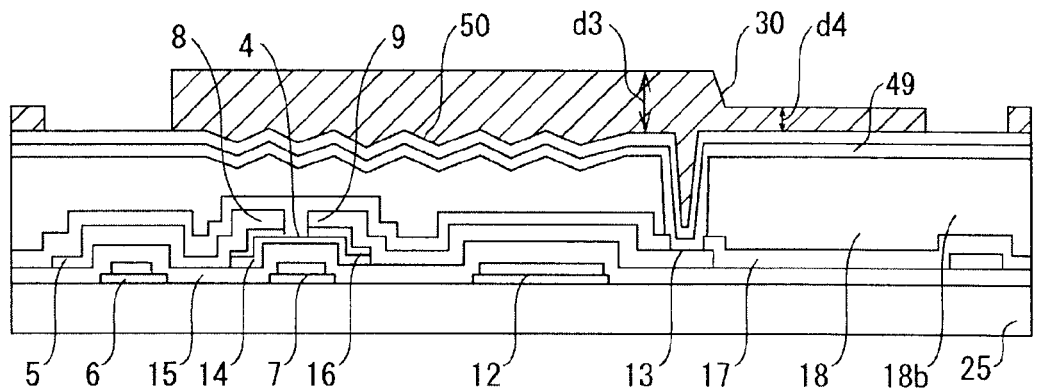
FIGS. 27A to 27C are cross-sectional views illustrating a step of manufacturing a TFT array substrate according to Embodiment 3.

More specifically, a thick-film resist pattern is formed on the formation regions of the reflective electrode 10 and the connection electrode. Thus, the thick-film resist pattern is formed on the formation regions of the pixel electrode and the connection electrode of the reflective region. In FIG. 27A, the thickness of the thick-film resist pattern is denoted by d3. A thin-film resist pattern is formed on the formation region of the pixel electrode configured by a single layer of the transmissive electrode 11. Thus, the thin-film resist pattern is formed on the formation region of the pixel electrode of the transmissive region. In FIG. 27A, the thickness of the thin-film resist pattern is denoted by d4. The resist 30 is obviously formed so that the thickness d4 is less than the thickness d3. The above-described step produces the configuration shown in FIGS. 27A to 27C.

The reflective film 50 and transparent conductive film 49 are then successively etched using the resist 30 having a two-stage film thickness as a mask. As a result, the reflective film 50 and the transparent conductive film 49 located in the region where the resist 30 has not been formed are removed. Thus, the reflective film 50 and transparent conductive film 49 are completely removed at the gate line terminal 28 and the peripheral region thereof. The above-described step produces the configuration shown in FIGS. 28A to 28C.

Figure 29A:
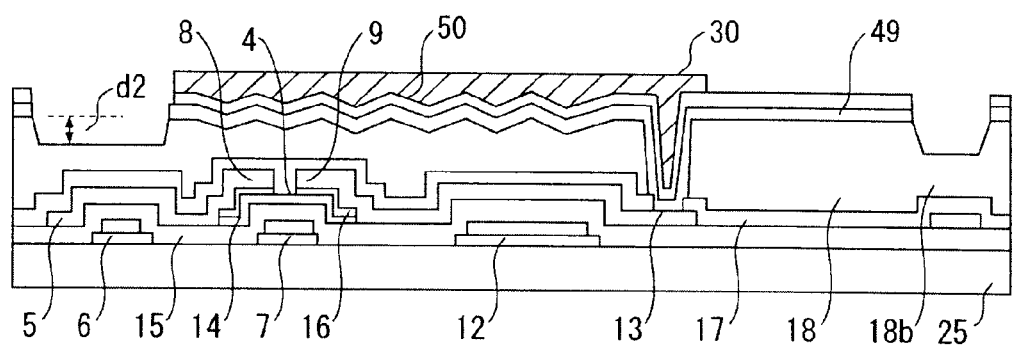
FIGS. 29A to 29C are cross-sectional views illustrating a step of manufacturing a TFT array substrate according to Embodiment 3.
Figure 29B:
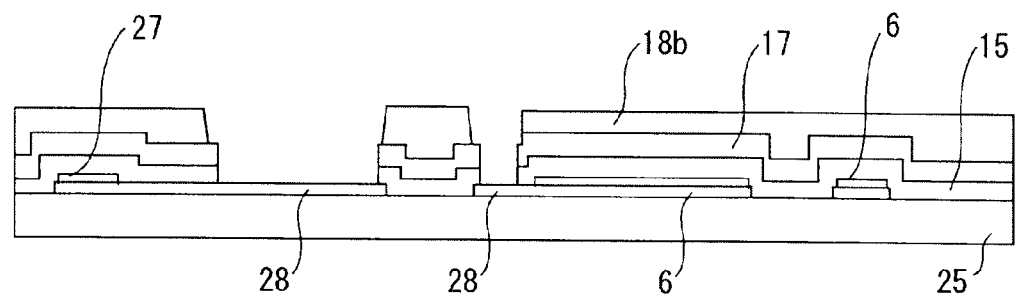
Figure 29C:
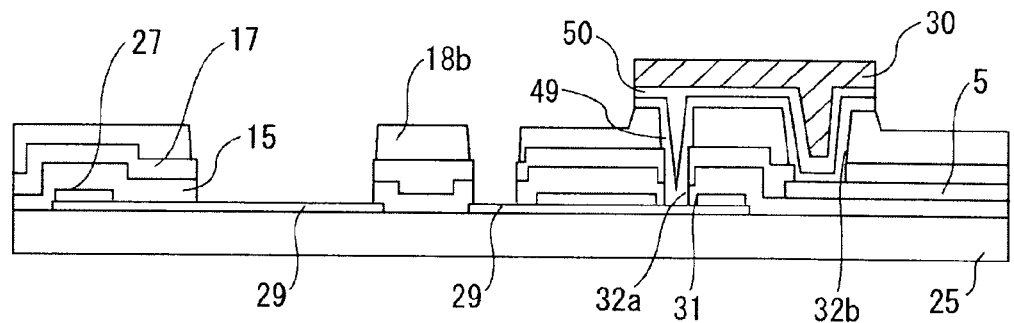

The thin-film resist pattern of the resist 30 is then removed by using a plasma ashing method. Thus, only the thick-film resist pattern is left and a resist pattern for forming the transmissive electrode 11 is obtained. As a result, the reflective film 50 is exposed in the formation region of the pixel electrode configured by a single layer of the transmissive electrode 11. Thus, the reflective film 50 is exposed in the formation region of the pixel electrode of the transmissive region. Furthermore, at the same time as the thin-film resist pattern is removed, the planarizing film 18 that has not been covered on the transparent conductive film 49 is etched. As a result, the thickness of the planarizing film 18 corresponding to regions other than the formation regions of the pixel electrode and the connection electrode is decreased. Thus, the thickness of the planarizing film 18 is reduced on the gate line 6, source line 5, and short ring line 27. In FIG. 29A, the thickness of the planarizing film 18 of reduced thickness is denoted by d2. The above-described step produces the configuration shown in FIGS. 29A to 29C.

The exposed reflective film 50 is then etched by using the thick-film resist pattern as a mask. As a result, the reflective electrode 10 is patterned. Thus, in the transmissive region, the reflective film 50 is removed, and the transparent conductive film 49 is exposed. The resist 30 is thereafter removed and the transmissive electrode 11 and reflective electrode 10 configuring the pixel electrode and the connection electrode are formed. More specifically, the transmissive electrode 11 and reflective electrode 10 are formed in the contact hole 13, and the pixel electrode and drain electrode 9 are electrically connected via the contact hole 13. The transmissive electrode 11 and reflective electrode 10 are then formed in the line contact holes 32a and 32b, and the lead-out line and source line 5 are electrically connected via the line contact holes 32a and 32b. Annealing is then carried out to crystallize the amorphous ITO of the transmissive electrode 11. As a result, the configuration shown in FIGS. 30A to 30C is obtained.

Figure 27B:
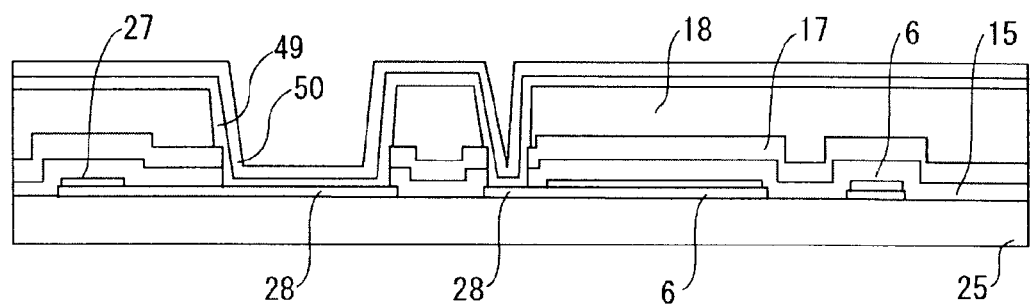
Figure 27C:
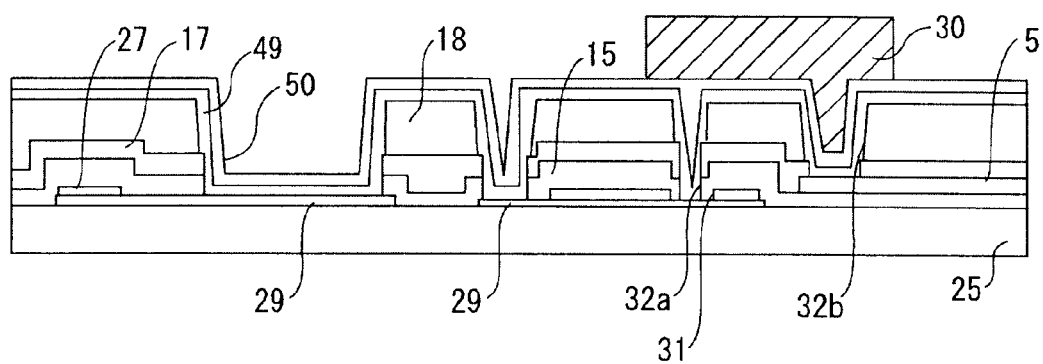
Figure 28A:
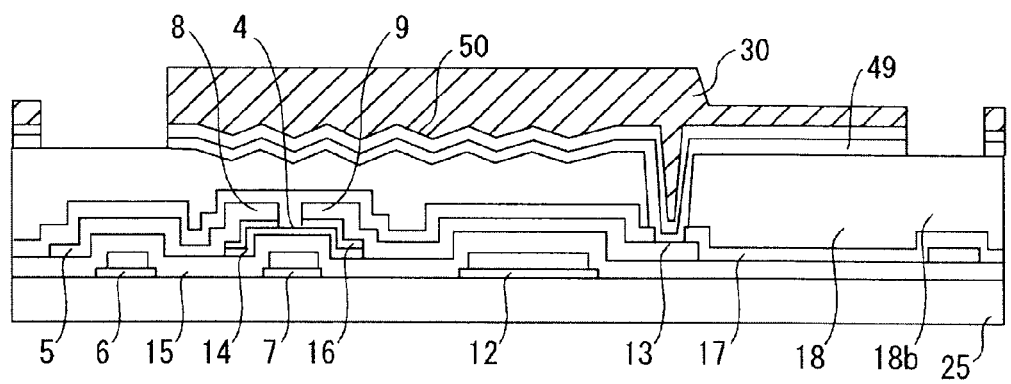
FIGS. 28A to 28C are cross-sectional views illustrating a step of manufacturing a TFT array substrate according to Embodiment 3.
Figure 28B:
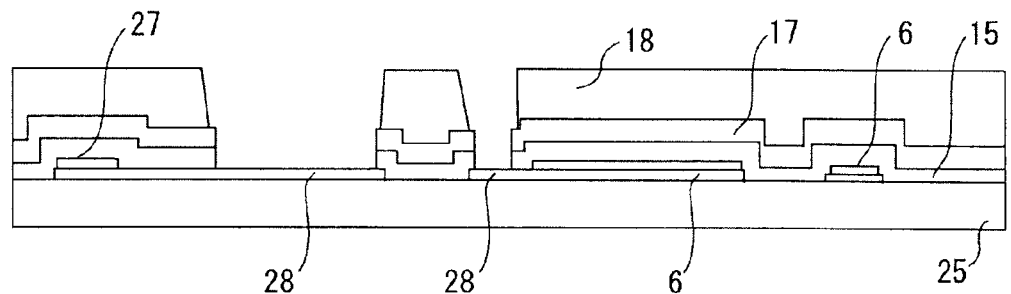
Figure 28C:
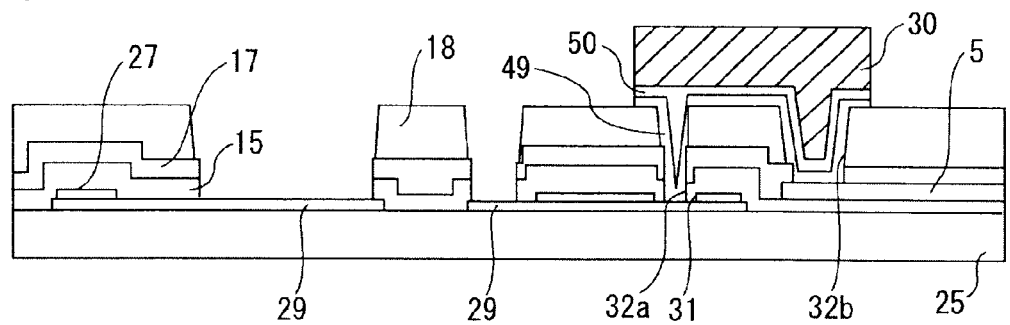

In the conventional step of forming the transmissive electrode 11 and the reflective electrode 10, in a case where patterning is performed using a resist having a two-step film thickness, the reflective film sometimes remains on the terminals due to fluctuations of the process. More specifically, under the effect of difference in level, the thin-film resist pattern has a thickness larger than the originally set thickness. Such a thin-film resist pattern of increased thickness cannot be entirely removed by ashing, and etching residue of the reflective film is generated. As a result, reliability of terminals cannot be ensured. However, with the present embodiment, as shown in FIG. 27A to 27C, because the resist pattern used as a mask is not present on the terminals, the reflective film is prevented from remaining on the terminals. As a result, sufficient reliability of terminals can be ensured.

Embodiment 4

Figure 31:
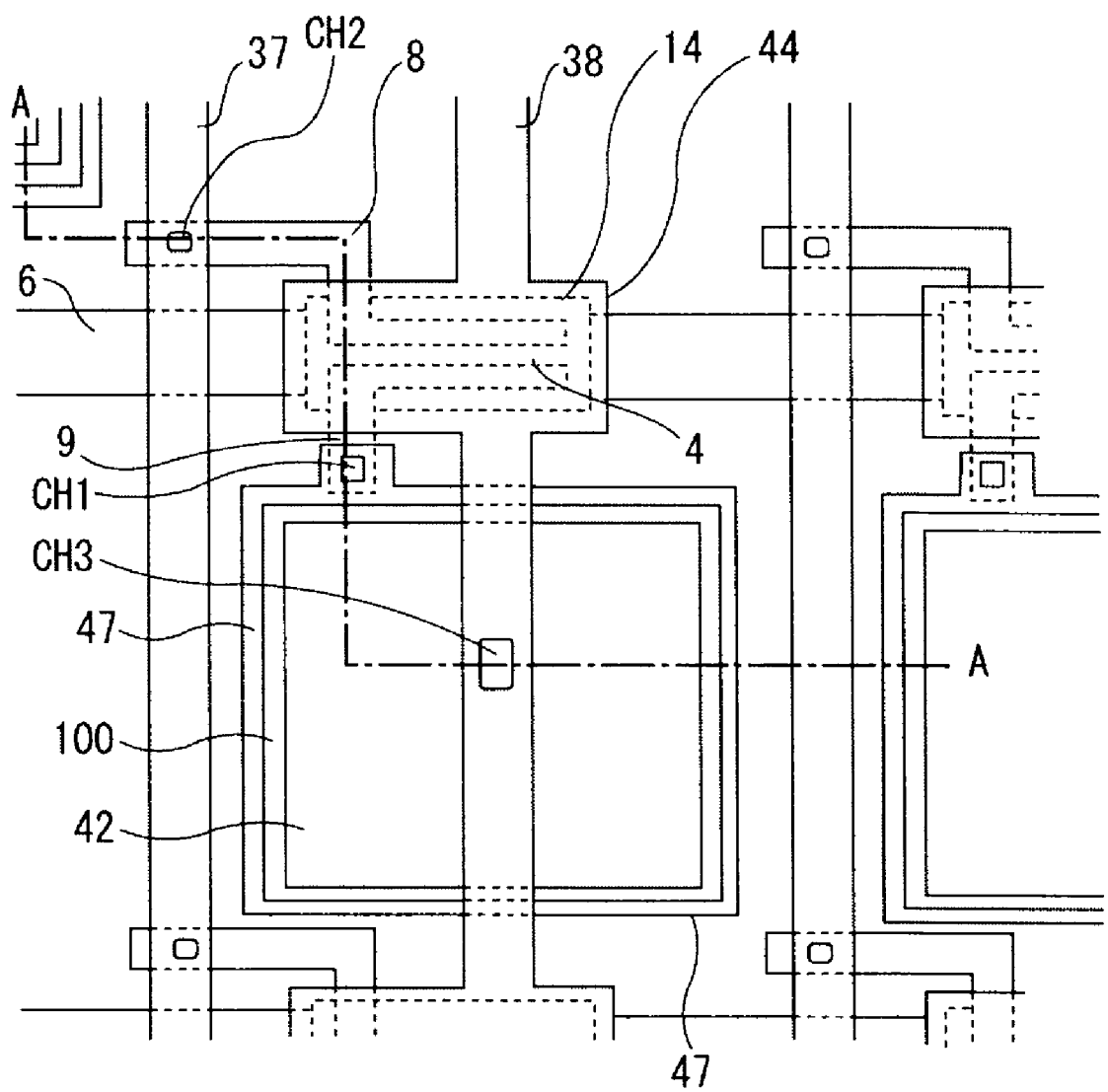
FIG. 31 is a plan view illustrating the configuration of a pixel according to Embodiment 4.
Figure 32:
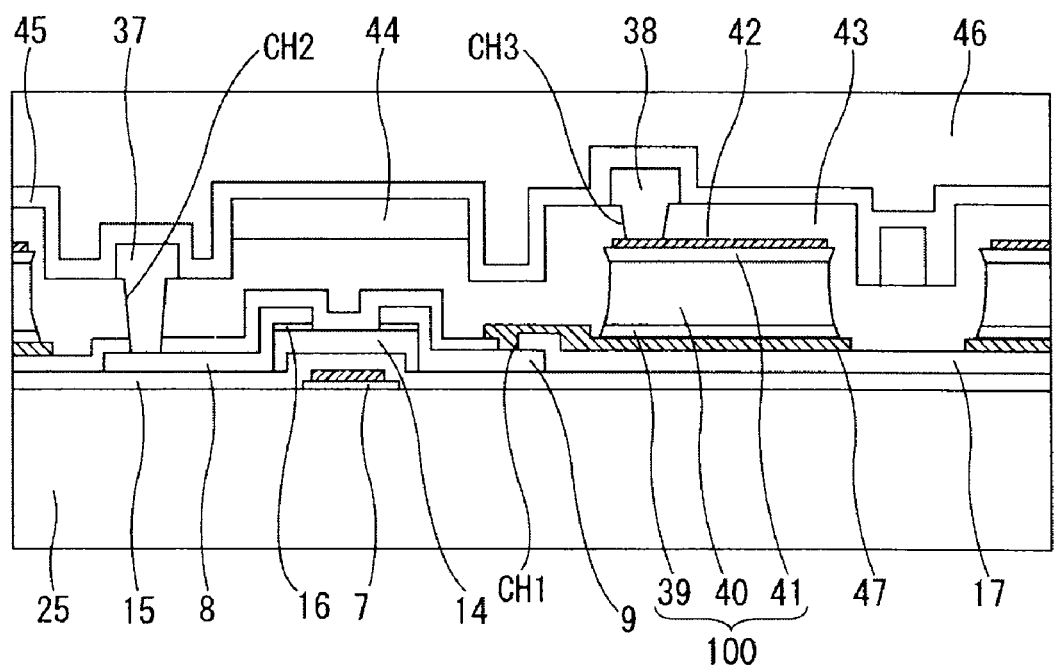
FIG. 32 is an A-A sectional view of the configuration shown in FIG. 31.

In the above-described embodiment, the TFT array substrate 1 for use in a display device is explained. In the present embodiment a TFT array substrate 1 for use in a sensing device will be explained. In the present embodiment, the TFT array substrate 1 has a configuration substantially similar to the configuration shown in FIG. 1. Accordingly, explanation of features common with the above-described embodiment will be omitted or simplified. Initially, the configuration of a pixel of the TFT array substrate 1 of the present embodiment will be explained with reference to FIGS. 31 and 32. FIG. 31 is a plan view illustrating the configuration of a pixel of the TFT array substrate 1. FIG. 32 is an A-A cross-sectional view of the configuration shown in FIG. 31.

In a detection region of the TFT array substrate 1, a plurality of gate lines 6, a plurality of data lines 37, and a plurality of bias lines 38 are formed. The plurality of gate lines 6 are provided parallel each other. Likewise, the plurality of data lines 37 and the plurality of bias lines 38 are provided parallel each other. The bias lines 38 are provided between respective adjacent data lines 37. Thus, the data lines 37 and bias lines 38 are disposed alternately.

The gate lines 6 and data lines 37 are formed to cross each other. Likewise, the gate lines 6 and bias lines 38 are formed to cross each other. The gate lines 6 are perpendicular to the data lines 37. Likewise, the gate lines 6 are perpendicular to the bias lines 38. A region surrounded by the adjacent gate lines 6 and adjacent data lines 37 is a pixel. Therefore, in the detection region, the pixels are arranged in a matrix-like configuration.

As shown in FIG. 32, a gate electrode 7 is formed on a transparent insulating substrate 25 composed of glass or the like. The gate electrode 7 extends from the gate line 6. The gate electrode 7 and the gate line 6 have configurations similar to those of Embodiment 1. The gate 7 has a two-layer structure in which a transparent conductive film and a metal film are successively stacked. In the gate electrode 7, the overlaying metal film is formed to be somewhat less than the underlying transparent conductive film pattern. A gate insulating film 15 is formed so as to cover the gate electrode 7.

A semiconductor layer 14 is formed on the gate insulating film 15. The semiconductor layer 14 is disposed opposite the gate electrode 7 via the gate insulating film 15. An ohmic contact layer 16 is formed on the semiconductor layer 14. The ohmic contact layer 16 is a semiconductor layer including a doping element and has electric conductivity. The ohmic contact layer 16 is formed at both ends of the semiconductor layer 14. Thus, the ohmic contact layer 16 is not present in the central portion of the semiconductor layer 14 above the gate electrode 7. A portion where the ohmic contact layer 16 has not been formed is a channel 4. A source-drain region is formed outside the channel 4.

A source electrode 8 and a drain electrode 9 are formed on the ohmic contact layer 16. The source electrode 8 is formed on the source region. The drain electrode 9 is formed on the drain region. As described hereinabove, the ohmic contact layer 16 is formed at both ends of the semiconductor layer 14. Thus, the source electrode 8 and drain electrode 9 are formed so as to sandwich the channel 4. As shown in FIG. 31, the source electrode 8 is formed to extend from the semiconductor layer 14 to the data line 37. The drain electrode 9 is formed to extend from the semiconductor layer 14 to a photodiode lower electrode 47.

A passivation film 17 is formed to cover the source electrode 8 and the drain electrode 9. A contact hole CH1 is formed in the passivation film 17 above the drain electrode 9. Thus, the passivation film 17 is not present in a portion above the drain electrode 9. The photodiode lower electrode 47 is formed in almost the entire pixel. Thus, the photodiode lower electrode 47 is formed in the region surrounded by the adjacent gate lines 6 and adjacent gate lines 37. The photodiode lower electrode 47 is embedded in the contact hole CH1. The photodiode lower electrode 47 and the drain electrode 9 are electrically connected via the contact hole CH1.

A photodiode 100 is formed on almost the entire photodiode lower electrode 47. In the present embodiment, a pin-structure photodiode is used as the photodiode 100. Thus, the photodiode 100 has a structure providing a true semiconductor layer (intrinsic layer) in which the number of carriers in the pn junction is small and the resistance is high. More specifically, a configuration is obtained in which an amorphous silicon ($n^+$ a-Si) film 39 doped with P, an intrinsic amorphous silicon (i-Si) film 40, and an amorphous silicon ($p^+$ a-Si) film 41 doped with B are successively stacked in the order of description from the side of the photodiode lower electrode 47. A transparent electrode 42 is formed on the photodiode 100. A configuration is thus obtained in which the photodiode 100 is sandwiched between the opposing electrodes. With such a configuration, the photodiode 100 functions as an optical sensor in which an output current varies correspondingly to the amount of incident light.

A second passivation film 43 is formed on the transparent electrode 42 to cover the aforementioned component. A contact hole CH2 is formed in the passivation film 17 on the source electrode 8 and second passivation film 43. Thus, the passivation film 17 and second passivation film 43 are not present in a portion on the source electrode 8. A contact hole CH3 is also formed in the second passivation film 43 on the transparent electrode 42. Thus, the second passivation film 43 is not present in a portion on the transparent electrode 42.

The data line 37, the bias line 38, and a light-shielding layer 44 are formed on the second passivation film 43. As shown in FIG. 31, the data line 37 extends linearly so as to pass through the contact hole CH2. The data line 37 is embedded in the contact hole CH2. The source electrode 8 and the data line 37 are electrically connected via the contact hole CH2. The data line 37 extends along a plurality of pixels 54. An electric charge converted by the photodiode 100 is read from the source electrode 8 of each pixel 54.

As shown in FIG. 31, the bias line 38 extends linearly so as to pass through the contact hole CH3. The bias line 38 is embedded in the contact hole CH3. The transparent electrode 42 and bias line 38 are electrically connected via the contact hole CH3. The bias line 38 extends along a plurality of pixels 54 and supplies a negative bias to the transparent electrode 42 of each pixel 54. As a result, the photodiode 100 is set to an OFF state. The light shielding layer 44 is formed on a TFT. The light shielding layer 44 is formed in a rectangular shape. The bias line 38 and light shielding layer 44 are formed integrally. Obviously, such a configuration is not limiting, and the bias line 38 and the light shielding layer 44 may be formed independently. Furthermore, the width of the light shielding layer 44 is greater than the width of the bias line 38. A third passivation film 45 and a fourth passivation film 46 are formed successively so as to cover the bias line and the light shielding layer. The fourth passivation film 46 has a flat surface. The forth passivation film 46 is formed, for example, from an organic resin.

Figure 33:
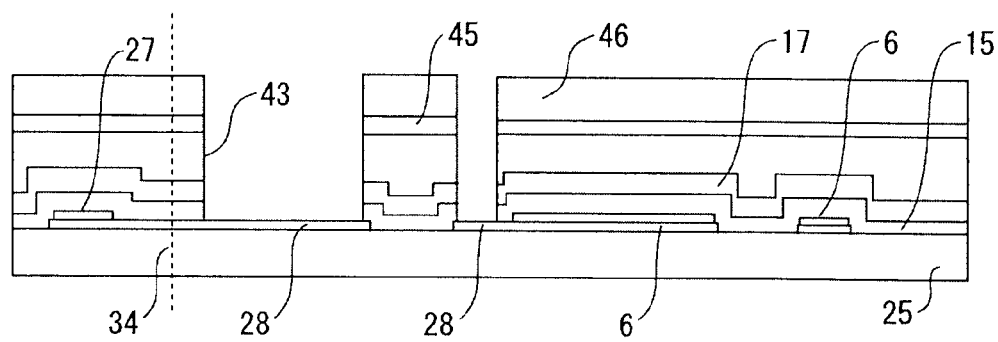
FIG. 33 is a cross-sectional view illustrating the configuration of a gate line terminal according to Embodiment 4 and a peripheral region thereof.

The gate line terminal 28 and the peripheral region thereof will be described hereinbelow with reference to FIG. 33. FIG. 33 is a cross-sectional view illustrating the configuration of the gate line terminal 28 and the peripheral region thereof.

The gate line terminal 28, short ring line 27, gate line 6, gate insulating film 15, and passivation film 17 are formed on the insulating substrate 25. These components have configurations similar to those of Embodiment 1. The second passivation film 43, third passivation film 45, and fourth passivation film 46 are formed successively on the passivation film 17. The second passivation film 43, third passivation film 45, and fourth passivation film 46 are formed in a portion shared with the underlying passivation film 17. Thus, an opening is formed in the gate insulating film 15, passivation film 17, second passivation film 43, third passivation film 45, and fourth passivation film 46 above the gate line terminal 28. Furthermore, a metal film of the same layer as the metal film of the gate line 6 is not present on the periphery of the gate line terminal 28 and the panel cutting line 34. Thus, the transparent conductive film extending from the transparent conductive film of the gate line 6 is exposed at the gate line terminal 28.

Figure 34:
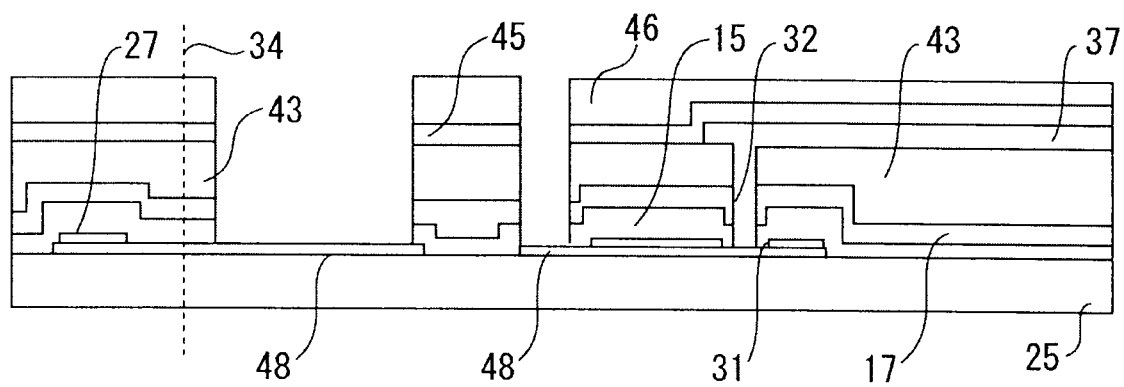
FIG. 34 is a cross-sectional view illustrating the configuration of a data line terminal according to Embodiment 4 and a peripheral region thereof.

The data line terminal 48 and the peripheral region thereof will be explained below with reference to FIG. 34. FIG. 34 is a cross-sectional view illustrating the configuration of the data line terminal 48 and the peripheral region thereof.

The data line terminal 48 and the short ring line 27 are formed on the insulating substrate 25. The data line terminal 48 and the lead-out line have configurations similar to those of the source line terminal 29 and the lead-out line in FIG. 16C referenced in Embodiment 1. The short ring line 27 also has a configuration similar to that of Embodiment 1. The gate insulating film 15, passivation film 17, and second passivation film 43 are formed successively to cover the aforementioned components. As a result, the metal films of the lead-out line and short ring line 27 are covered by these insulating films. The line contact hole 32 is formed in the gate insulating film 15, passivation film 17, and second passivation film 43 above the lead-out line. The line contact hole 32 is formed on the inside of the overlayer metal removal portion 31.

The data line 37 is embedded in the line contact hole 32. The lead-out line and the data line 37 are electrically connected via the contact hole 32. As a result, the data line terminal 48 and data line 37 are electrically connected. The third passivation film 45 and fourth passivation film 46 are formed successively so as to cover the data line 37. Similarly to Embodiment 1, an opening is formed in the gate insulating film 15, passivation film 17, second passivation film 43, third passivation film 45, and fourth passivation film 46 above the data line terminal 48. Furthermore, a metal film of the same layer as the metal film of the lead-out line is not present on the periphery of the data line terminal 48 and panel cutting line 34. Thus, in the data line terminal 48, a transparent conductive film extending from the transparent conductive film of the lead-out line is exposed.

The TFT array substrate 1 of the present embodiment has the above-described configuration. The effect that can be demonstrated with the TFT array substrate 1 of the present embodiment is similar to that of Embodiment 1.

Figure 35:
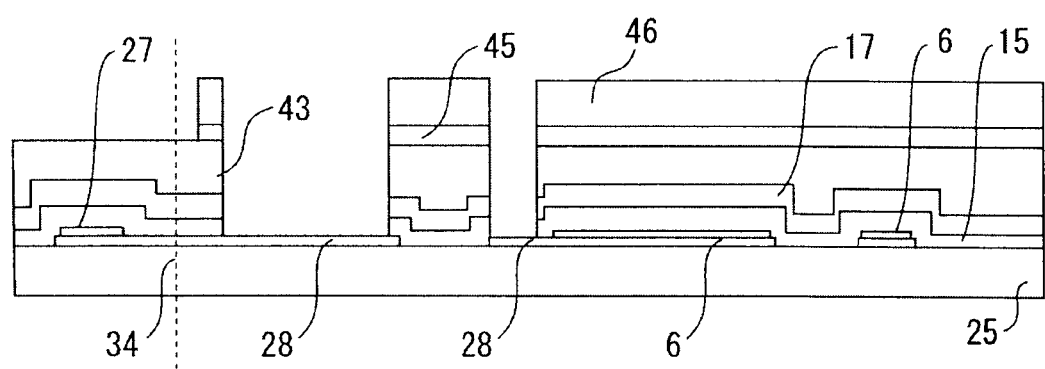
FIG. 35 is a cross-sectional view illustrating the second configuration of a gate line terminal according to Embodiment 4 and a peripheral region thereof.

In the explanation above, the third passivation film 45 and fourth passivation film 46 are formed also on the periphery of the gate line terminal 28, data line terminal 48, and panel cutting line 34, but such as configuration is not limiting. For example, as shown in FIG. 35, the third passivation film 45 and fourth passivation film 46 on the periphery of the panel cutting line 34 may be removed. Thus, the third passivation film 45 and fourth passivation film 46 may be removed from a zone on the metal film of the short ring line 27.

Figure 36:
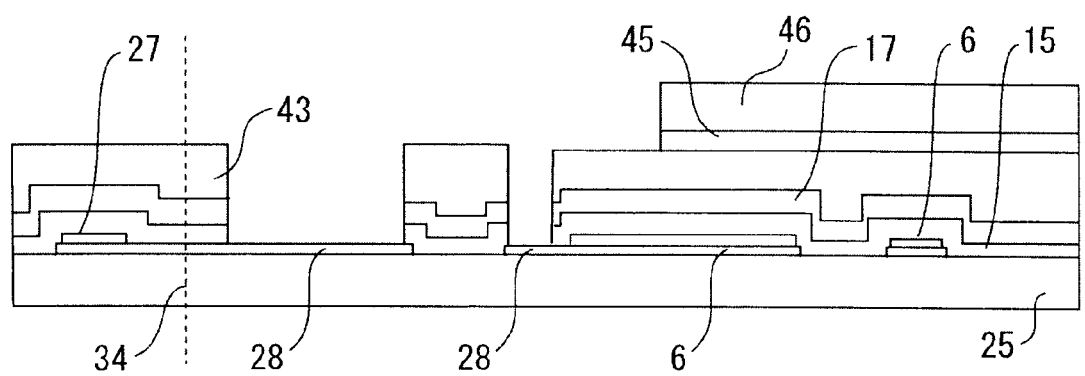
FIG. 36 is a cross-sectional view illustrating the third configuration of a gate line terminal according to Embodiment 4 and a peripheral region thereof.
Figure 37A:
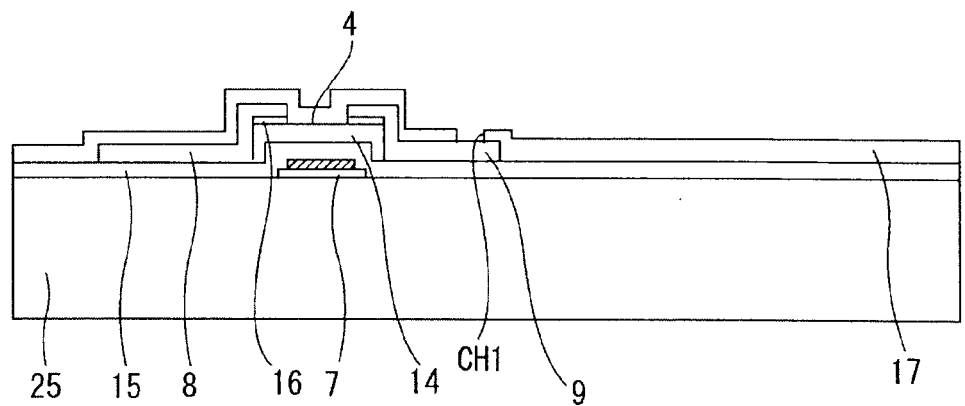
FIGS. 37A to 37C are cross-sectional views illustrating a step of manufacturing a TFT array substrate according to Embodiment 4.
Figure 37B:
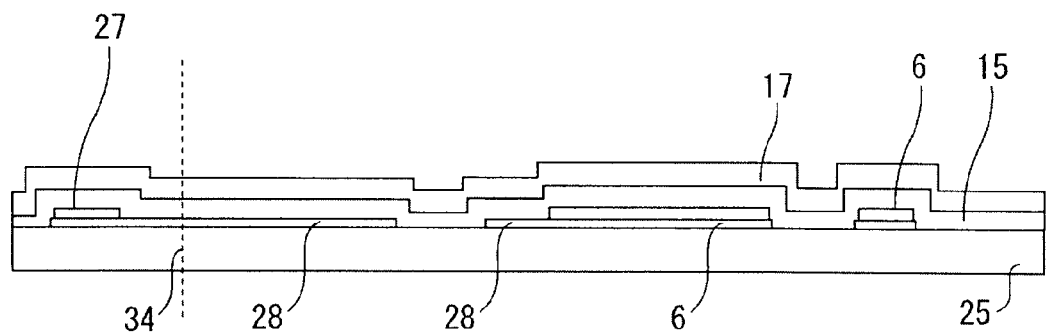
Figure 37C:
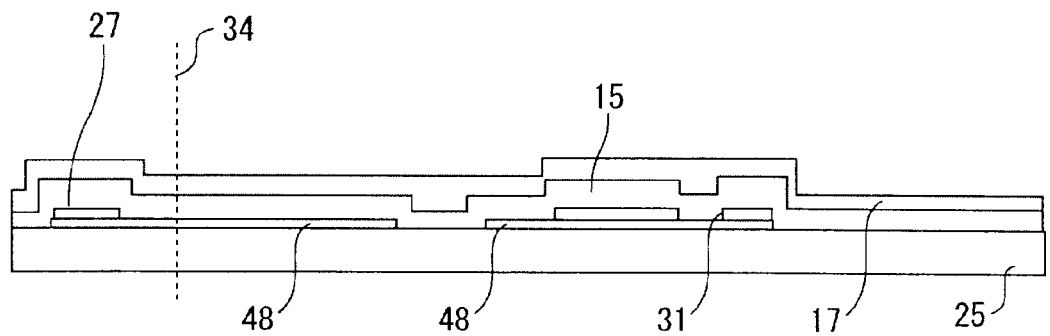
Figure 38A:
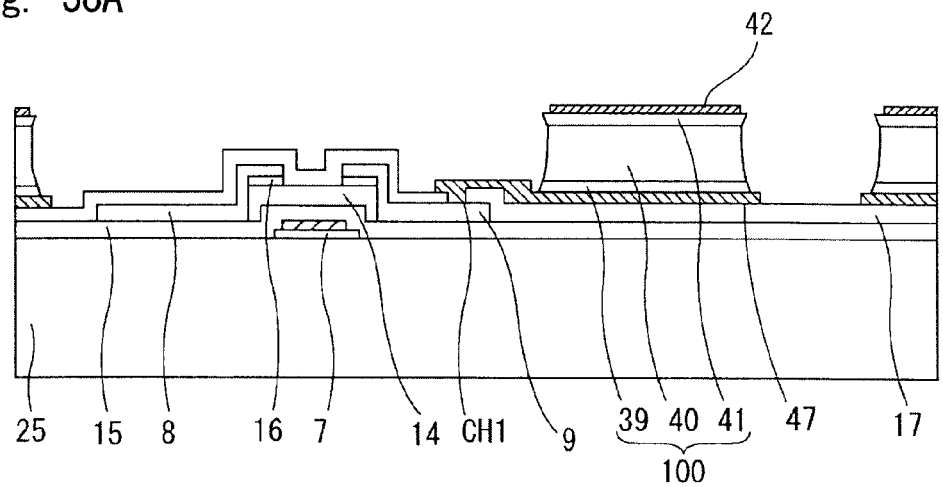
FIGS. 38A to 38C are cross-sectional views illustrating a step of manufacturing a TFT array substrate according to Embodiment 4.
Figure 38B:
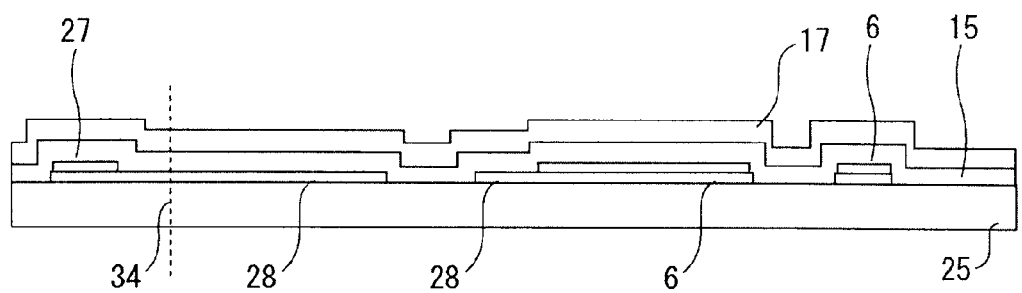
Figure 38C:
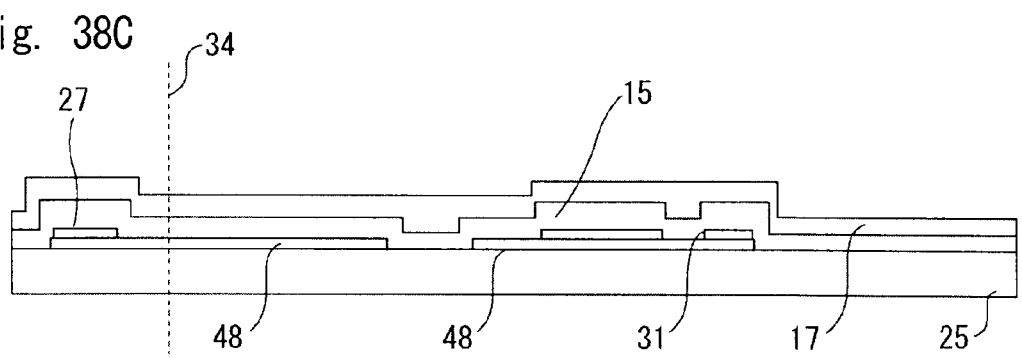
Figure 39A:
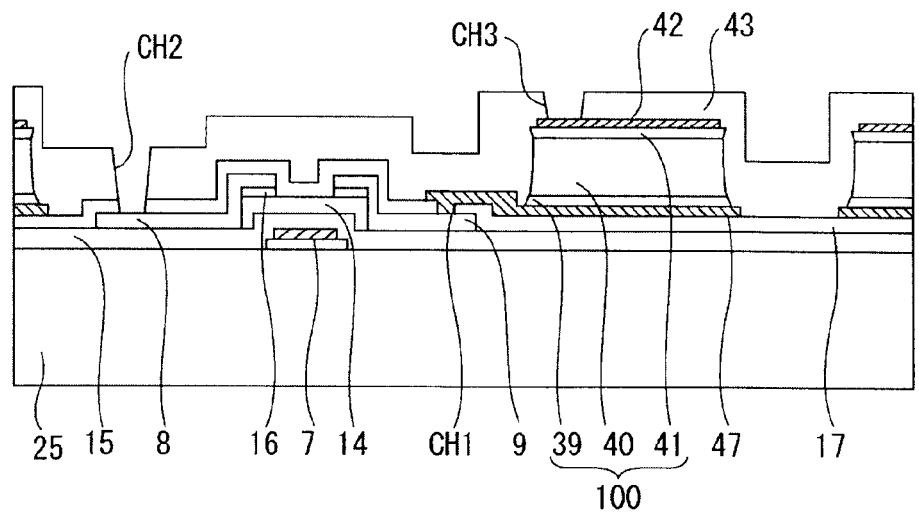
FIGS. 39A to 39C are cross-sectional views illustrating a step of manufacturing a TFT array substrate according to Embodiment 4.
Figure 39B:
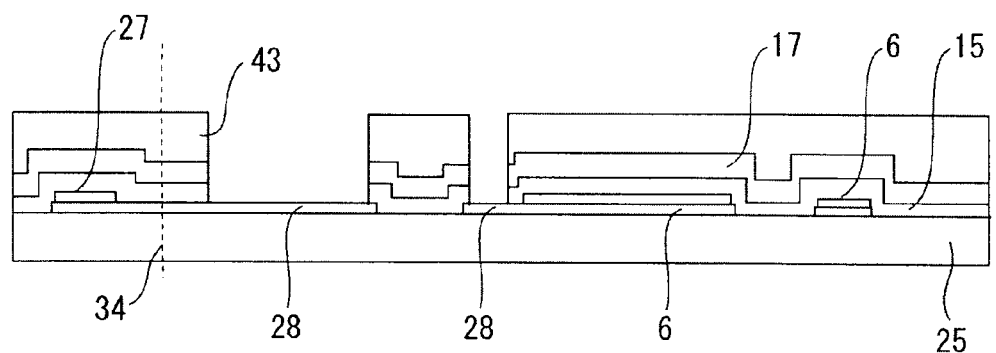
Figure 39C:
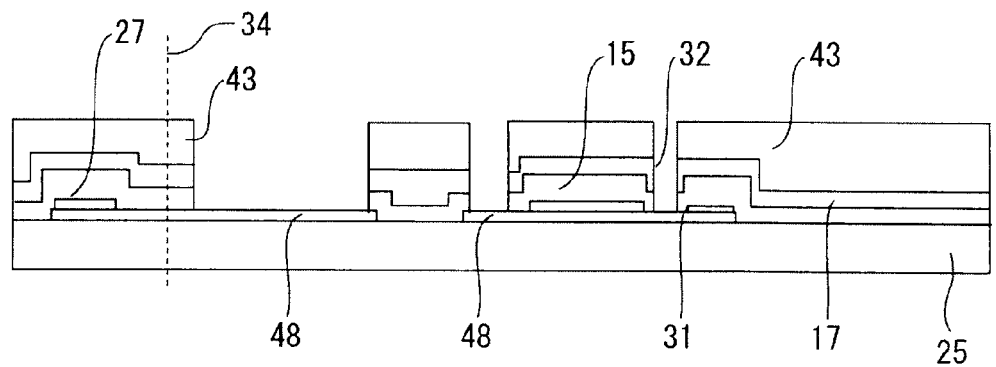
Figure 40A:
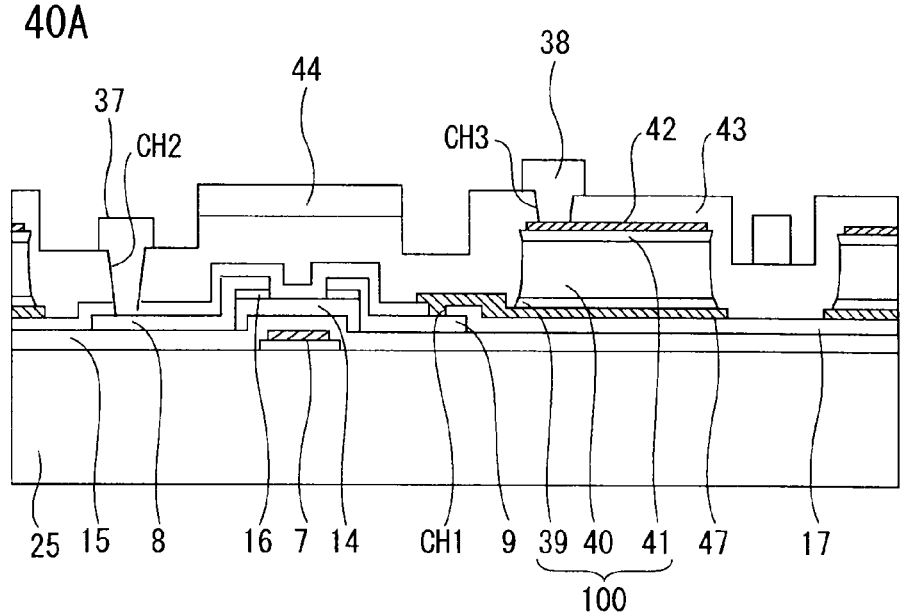
FIGS. 40A to 40C are cross-sectional views illustrating a step of manufacturing a TFT array substrate according to Embodiment 4.
Figure 40B:
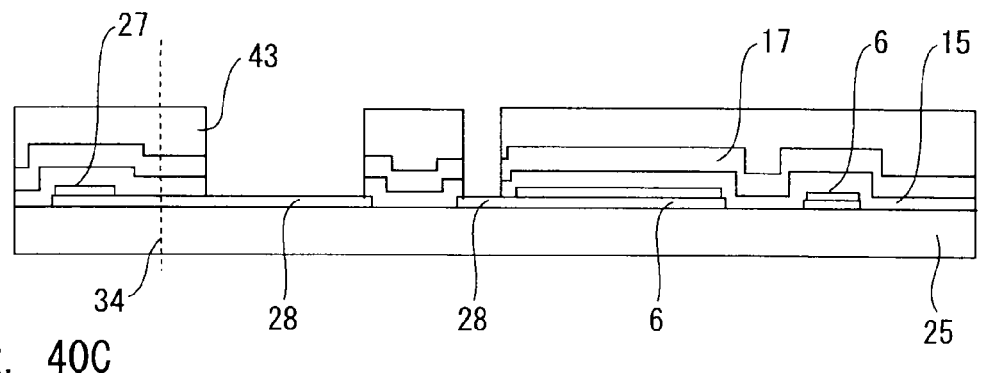
Figure 40C:
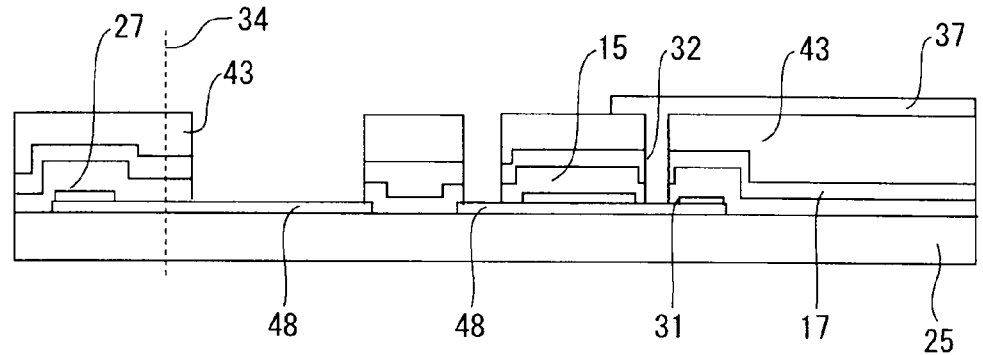

Furthermore, the third passivation film 45 and fourth passivation film 46 located on the periphery of the gate line terminal 28 and panel cutting line 34 may be also removed, as shown in FIG. 36. Thus, the third passivation film 45 and fourth passivation film 46 may be removed over the zone above the short ring line 27 from the periphery of the gate line terminal 28. With such a configuration, substrate cutting defects can be inhibited and press bonding defects in the input terminal leading from the outside can be reduced. The other example of the gate line terminal 28 and the peripheral region thereof is explained hereinabove with reference to FIGS. 35 and 36, but a similar configuration can be also obtained with the data line terminal 48 and the peripheral region thereof.

A method for manufacturing the TFT array substrate 1 of the present embodiment will be explained below with reference to FIGS. 37A to 40C. FIGS. 37A to 40C are cross-sectional views illustrating the step of manufacturing the TFT array substrate 1. FIGS. 37A, 38A, 39A, and 40A illustrate the manufacturing step in the A-A cross section of FIG. 31. FIGS. 37B, 38B, 39B, and 40B illustrate the step of manufacturing the gate line terminal 28 and the peripheral region thereof. FIGS. 37C, 38C, 39C, and 40C illustrate the step of manufacturing the data line terminal 48 and the peripheral region thereof.

The manufacturing step up to the formation of the source electrode 8 and drain electrode 9 is similar to that of Embodiment 1. The data line terminal 48 and the peripheral region thereof are formed similarly to the source line terminal 29 and the peripheral region thereof in Embodiment 1. Furthermore, in the present embodiment, the common line 12 is not formed. As a result, the shape of the resistor 30 is changed with respect to that of Embodiment 1, and the transparent conductive film and metal film of the region where the common line 12 is formed are removed. Plasma treatment with $H_2$, He, or the like is performed to improve characteristics. The passivation film 17 is formed by using a plasma CVD method or the like to cover the aforementioned components. In the present embodiment, a silicon oxide ($SiO_2$) film with a low dielectric contact is used as the passivation film 17. The $SiO_2$ film is formed to a thickness of 200 nm to 400 nm. A resist for forming the contact hole CH1 is then formed by a fourth photoengraving step. The passivation film 17 is then etched by a dry etching method by using the resist as a mask. The contact hole CH1 is then formed by removing the resist. More specifically, the contact hole CH1 is formed by removing the passivation film 17 located on the drain electrode 9. Thus, the drain electrode 9 is exposed in the contact hole CH1. The above-described step produces the configuration shown in FIGS. 37A to 37C.

A conductive film composed of the photodiode lower layer 47 is then formed by a sputtering method. The conductive film is embedded in the contact hole CH1. A metal with ohmic contact, such as a Cr film, is used as the conductive film. The $n^+$ a-Si film 39, i-Si film 40, and $p^+$ a-Si film 41 are thereafter successively formed using a plasma CVD method. These components constitute the photodiode 100. Furthermore, these components can be formed successively in the same deposition chamber, without ever breaking the vacuum. The $n^+$ a-Si film 39 has a thickness of 20 to 100 nm, the i-Si film 40 has a thickness of 0.5 μm to 2.0 μm, and the $p^+$ a-Si film 41 has a thickness of 10 nm to 50 nm. A transparent conductive film is formed on the $p^+$ a-Si film 41. In this case, the amorphous transparent conductive film is formed by a sputtering method using any target from among amorphous ITO, IZO, ITZO, and ITSO.

A resist for forming a transparent electrode 42 is then formed on the transparent conductive film by a fifth photoengraving step. The transparent conductive film is then etched by using the resist as a mask. In this case, for example, wet etching is performed using oxalic acid. The resist is then removed and the transparent electrode 42 is formed. In the present embodiment, a film including any from among amorphous ITO, IZO, ITZO, and ITSO is used as the transparent conductive film. As result, the transparent conductive film can be formed in a non-crystalline state including practically no fine crystal grains on the underlying $p^+$ a-Si film 41. Therefore, the effect of preventing etching residues is demonstrated. A film in which the above-described materials are mixed may be also used as the transparent conductive film. A structure in which films composed of respective materials are stacked may be also used and the mixed films may be also laminated.

A resist for forming an a-Si film is then formed on the transparent electrode 42 by a sixth photoengraving step. The resist used herein has a pattern one size larger than the pattern of the transparent electrode 42. The a-Si film is then etched by using the resist as the mask. Thus, three layers: $n^+$ a-Si film 39, i-Si film 40, and $p^+$ a-Si film 41 are etched. In this case, for example, dry etching using plasma of a mixed gas of $SF_6$ and HCl is used. The resist is then removed and the photodiode 100 is formed.

A resist for forming the photodiode lower electrode 47 is then formed by a seventh photoengraving method. The resist in this case has a pattern one size larger than the pattern of the photodiode 100. The conductive film is etched by using the resist as a mask. In this case, for example, wet etching using a mixed liquid of nitric acid and ammonium cerium nitrate is used. The resist is thereafter removed and the photodiode lower electrode 47 is formed. The photodiode lower electrode 47 is also formed in the contact hole CH1, and the photodiode lower electrode 47 and the drain electrode 9 are electrically connected via the contact hole CH1. At the gate line terminal 28 and the peripheral region thereof, the above-described conductive film, a-Si film, and transparent conductive film are completely removed. They are likewise removed at the data line terminal 48 and the peripheral region thereof. The above-described step produces the configuration shown in FIGS. 38A to 38C.

The second passivation film 43 for protecting the photodiode 100 is then formed on the transparent electrode 42. The second passivation film 43 is formed to decrease additional capacitance applied to the data line 37 and bias line 38. Accordingly, for example, a silicon oxide film with a low dielectric constant that is formed to a thickness of 0.5 μm to 1.5 μm is used as the second passivation film 43. The silicon oxide film is indicated as the second passivation film 43, but a SiN film may be also used and a stacked film with a SOG film for step difference reduction may be also used.

A resist for forming the contact holes CH2, CH3, and 32, an opening of the gate line terminal 28, and an opening of the data line terminal 48 is then formed by an eighth photoengraving step. The second passivation film 43, passivation film 17, and gate insulating film 15 are then etched by using the resist as a mask. In this case, dry etching using plasma of a mixed gas of $CF_4$ and Ar is performed. The contact holes CH2, CH3, and 32, the opening of the gate line terminal 28, and the opening of the data line terminal 48 are then formed by removing the resist.

More specifically, the passivation film 17 and second passivation film 43 above the source electrode 8 are removed and the contact hole CH2 is formed. Thus, the source electrode 8 is exposed in the contact hole CH2. The second passivation film 43 above the transparent electrode 42 is then removed and the contact hole CH3 is formed. Thus, the transparent electrode 42 is exposed in the contact hole CH3.

The gate insulating film 15, passivation film 17, and second passivation film 43 above the lead-out line within the overlayer metal removal portion 31 are then removed and the contact hole 32 is formed. Thus, the transparent conductive film of the lead-out line is exposed in the contact hole 32. The gate insulating film 15, passivation film 17, and second passivation film 43 above the gate line terminal 28 and data line terminal 48 are then removed, and an opening of the gate line terminal 28 and data line terminal 48 is formed. Thus, the gate line terminal 28 and the data line terminal 48 are exposed. The above-described step produces the configuration shown in FIGS. 39A to 39C.

A conducive film that will serve as the data line 37, bias line 38, and light shielding layer 44 is then formed. the conductive film is embedded in the contact holes CH2 and CH3. An Al alloy that has a low electric resistance, an excellent heat resistance, and an excellent contact characteristic with the transparent conductive film is used as the conductive film. For example, an AlNiNd film is used as the conductive film. The AlNiNd film is formed to a thickness of 0.5 μm to 1.5 μm. The conductive film may be a single layer of AlNiNd or a laminate of AlNiNd with a high-melting metal such as Mo, a Mo alloy, or Cr. Furthermore, AlNiNdN may be formed by nitriding on the AlNiNd to inhibit a reaction with a developing solution.

A resist for forming the data line 37, bias line 38, and light shielding layer 44 is then formed by a ninth photoengraving step. The conductive film is then etched by using the resist as a mask. In a case where a stacked film of AlNiNd and Mo is used as the conductive film, wet etching using a mixed liquid of phosphoric acid, nitric acid, and acetic acid is performed. The resist is then removed and the data line 37, bias line 38, and light shielding layer 44 are removed. Furthermore, the data line 37 is formed in the contact hole CH2, and the data line 37 and the source electrode 8 are connected via the contact hole CH2. The bias line 38 is formed in the contact hole CH3, and the bias line 38 and the transparent electrode 42 are connected via the contact hole CH3. At the gate line terminal 28 and the peripheral region thereof, the conductive film forming the data line 37 and the like is entirely removed. The above-described step produces the configuration shown in FIGS. 40A to 40C.

The third passivation film 45 and fourth passivation film 46 are thereafter successively formed to protect the data line 37 and bias line 38. For example, a SiN film is used as the third passivation film 45, and a planarizing film is used as the fourth passivation film 46. A resist for forming a opening of the gate line terminal 28 and data line terminal 48 is then formed by a tenth photoengraving step. The third passivation film 45 and the fourth passivation film 46 are then etched by using the resist as a mask. As a result, the gate line terminal 28 and the data line terminal 48 are exposed.

In this case, dry etching is performed using plasma of a mixed gas of $CF_4$ and $O_2$. The etching gas is not limited to a mixed gas of $CF_4$ and $O_2$ and other gases can be also used. By using a planarizing film having photosensitivity as the fourth passivation film 46, it is possible to perform patterning by exposure and development, without using a resist in the tenth photoengraving step. Furthermore, as described hereinabove, even when the gate insulating film 15 and passivation films 17, 43, 45, and 46 are partially removed, these insulating films are formed so as to cover at least the metal film of the same layer as the metal film of the gate line 6. The above-described step produces the configuration shown in FIGS. 32, 33, and 34.

The manufacture of the TFT array substrate 1 is then completed by cutting along the panel cutting line 34. The effect that can be demonstrated with the TFT array substrate 1 of the present embodiment is similar to that of Embodiment 1.

In the above-described embodiments, the TFT array substrate 1 for use in a liquid crystal display device, a FFS mode liquid crystal display device, a transflective liquid crystal display device, and a photosensing device is explained, but such applications are not limiting. For example, the TFT array substrate 1 may be also used in other display devices or sensing devices. The effect demonstrated in these cases is also similar to that produced in the above-described embodiments.

The first, second, third, fourth exemplary embodiments can be combined as desirable by one of ordinary skill in the art.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A TFT substrate comprising:
    a plurality of pixels;
    a transparent conductive film pattern forming a terminal connectable from outside of the TFT substrate, and a first line extending from the terminal;
    a metal film formed on a surface of the transparent conductive film pattern and not formed on a surface of the terminal;
    an insulating film covering the metal film;
    a contact hole formed in the insulating film above the first line;
    a third line formed on the insulating film; and
    a connection electrode arranged within the contact hole and electrically connecting the first line to the third line,
    wherein the metal film of the first line is removed over the contact hole.

2. The TFT substrate according to claim 1, further comprising:
    a plurality of pixels, and
    a common line that is formed along the plurality of pixels by the transparent conductive film pattern.

3. The TFT substrate according to claim 1, wherein the terminal is a terminal for connection to the outside of the TFT substrate.

4. The TFT substrate according to claim 1, comprising a reflective region and a transmissive region,
    the TFT substrate further comprising a pixel electrode arranged on the insulating film and having a reflective region and a transmissive region, wherein
    the pixel electrode comprises a transmissive electrode arranged in the reflective region and the transmissive region and a reflective electrode arranged on the transmissive electrode of the reflective region on the outside of the transmissive region.

5. The TFT substrate according to claim 1, further comprising:
    a second line having the transparent conductive film pattern formed from the terminal to a substrate end and the metal film formed on the transparent conductive film pattern on a surface of the substrate end.

6. The TFT substrate according to claim 1, wherein the metal film comprises an Al alloy.

7. A liquid crystal display device comprising the TFT substrate according to claim 2, and further comprising pixel electrodes arranged in the respective pixels, wherein
    an electric field is generated obliquely downward with respect to a substrate surface from the pixel electrodes to the common line.

* * * * *